United States Patent
David et al.

(10) Patent No.: US 10,734,549 B2
(45) Date of Patent: Aug. 4, 2020

(54) HIGH EFFICIENCY GROUP-III NITRIDE LIGHT EMITTING DIODE

(71) Applicant: SORAA, INC., Fremont, CA (US)

(72) Inventors: Aurelien J. F. David, San Francisco, CA (US); Christophe Hurni, Fremont, CA (US); Nathan Young, Fremont, CA (US)

(73) Assignee: ECOSENSE LIGHTING, INC., Los Angeles, CA (US)

(*) Notice: Subject to any disclaimer, the term of this patent is extended or adjusted under 35 U.S.C. 154(b) by 0 days.

(21) Appl. No.: 16/446,022

(22) Filed: Jun. 19, 2019

(65) Prior Publication Data
US 2019/0386178 A1    Dec. 19, 2019

Related U.S. Application Data

(60) Provisional application No. 62/687,186, filed on Jun. 19, 2018.

(51) Int. Cl.
*H01L 33/00* (2010.01)
*H01L 33/32* (2010.01)
*H01L 33/06* (2010.01)

(52) U.S. Cl.
CPC .............. *H01L 33/32* (2013.01); *H01L 33/06* (2013.01)

(58) Field of Classification Search
CPC ....... H01L 33/06; H01L 33/32; H01L 33/007; H01L 33/025; H01L 33/0095; G01R 31/2635

See application file for complete search history.

(56) References Cited

U.S. PATENT DOCUMENTS

| 2013/0200391 | A1* | 8/2013 | Bedair | H01L 21/0237 257/76 |
| 2016/0197232 | A1* | 7/2016 | Bour | H01L 33/20 257/13 |
| 2016/0315218 | A1* | 10/2016 | Bour | H01L 33/20 |
| 2017/0170360 | A1* | 6/2017 | Bour | H01L 33/145 |
| 2018/0277715 | A1* | 9/2018 | Ma | H01L 33/06 |

OTHER PUBLICATIONS

Karpov, "ABC-model for interpretation of internal quantum efficiency and its droop in III-nitride LEDs: a review", 2015, Opt Quant Electron (2015) 47:1293-1303, Published on Oct. 25, 2014 (Year: 2015).*

(Continued)

*Primary Examiner* — Nikolay K Yushin
(74) *Attorney, Agent, or Firm* — FisherBroyles LLP

(57) ABSTRACT

A method of improving high-current density efficiency of an LED, said method comprising: (a) preparing a series of LEDs having decreasing defect densities, wherein each LED of said series has a peak IQE of at least 50%, and wherein each LED of said series has the same epitaxial structure; (b) determining an increase in IQEs at high-current density between at least two LEDs of said series; (c) preparing at least an additional LED of said series by reducing defect density relative to the previously obtained lowest defect density; and (d) reiterating steps (b) and (c) until said increase is at least 3% between two LEDs of said series having a decrease X in defect densities.

22 Claims, 36 Drawing Sheets

(56) References Cited

OTHER PUBLICATIONS

David et al. Carrier dynamics and Coulomb-enhanced capture in III-nitride quantum heterostructures, Applied Physics Letters 109, 033504 (2016) 5 pages.

David et al., All-optical measurements of carrier dynamics in bulk-GaN LEDs: Beyond the ABC approximation, Appl. Phys. Lett. 110, 253504 (2017) 5 pages.

David et al., Field-assisted Shockley-Read-Hall recombinations in III-nitride quantum wells, Appl. Phys. Lett. 111, 233501 (2017) 5 pages.

* cited by examiner

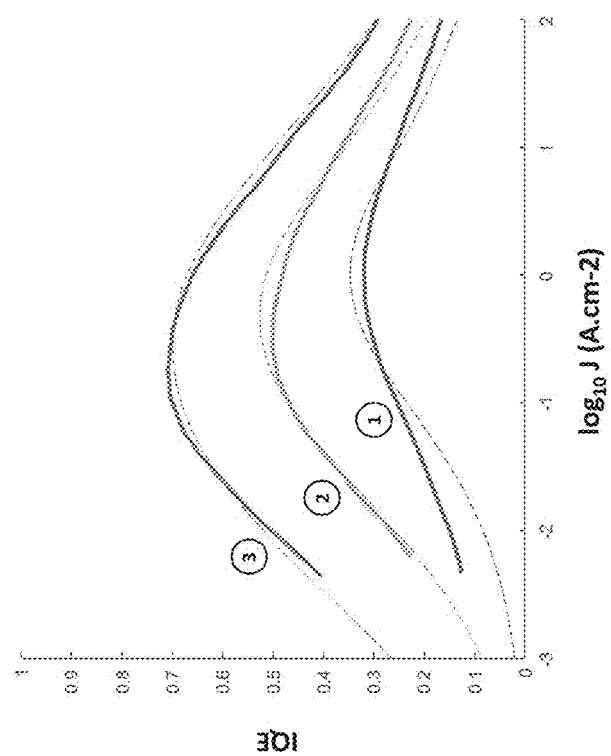
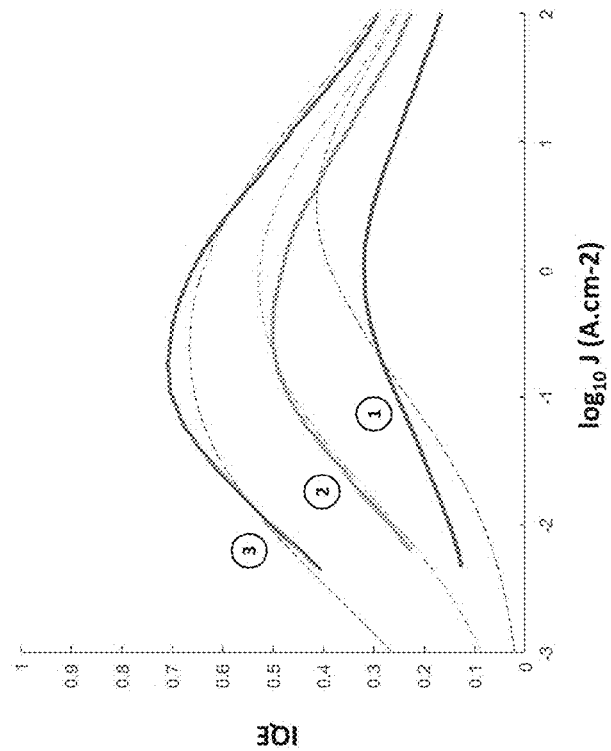
FIG. 11B
FIG. 11A

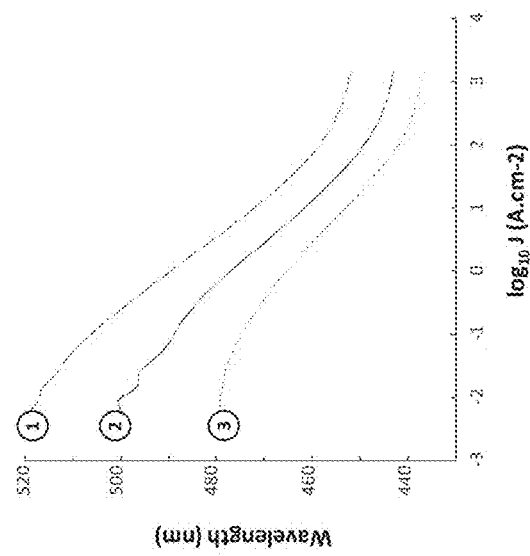
FIG. 13C
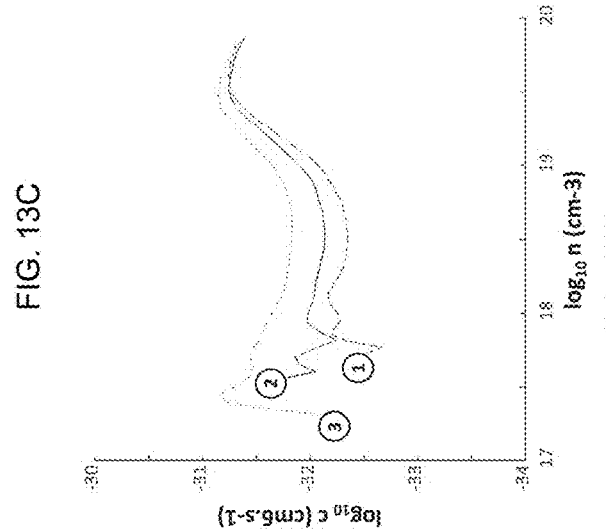
FIG. 13F
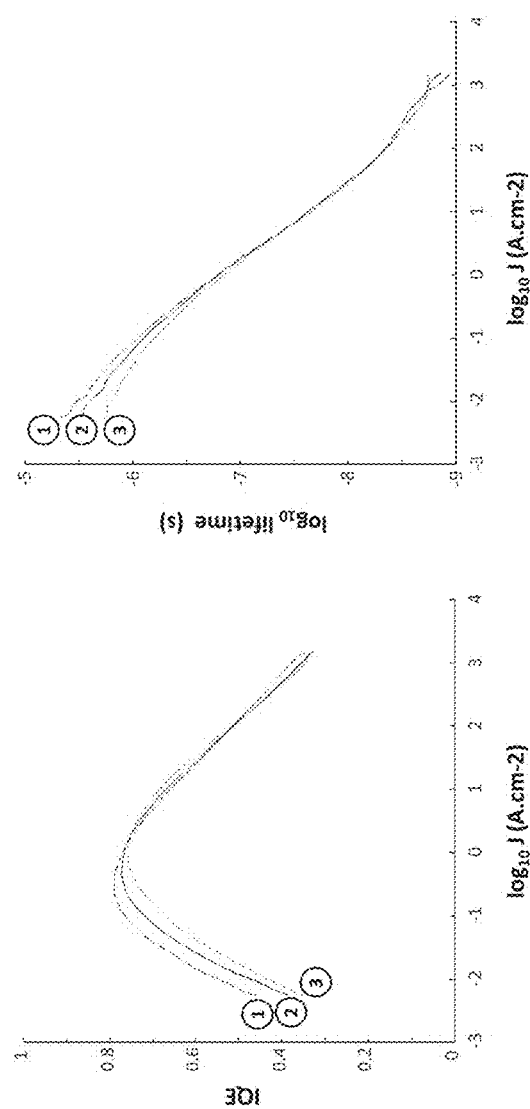
FIG. 13B
FIG. 13A
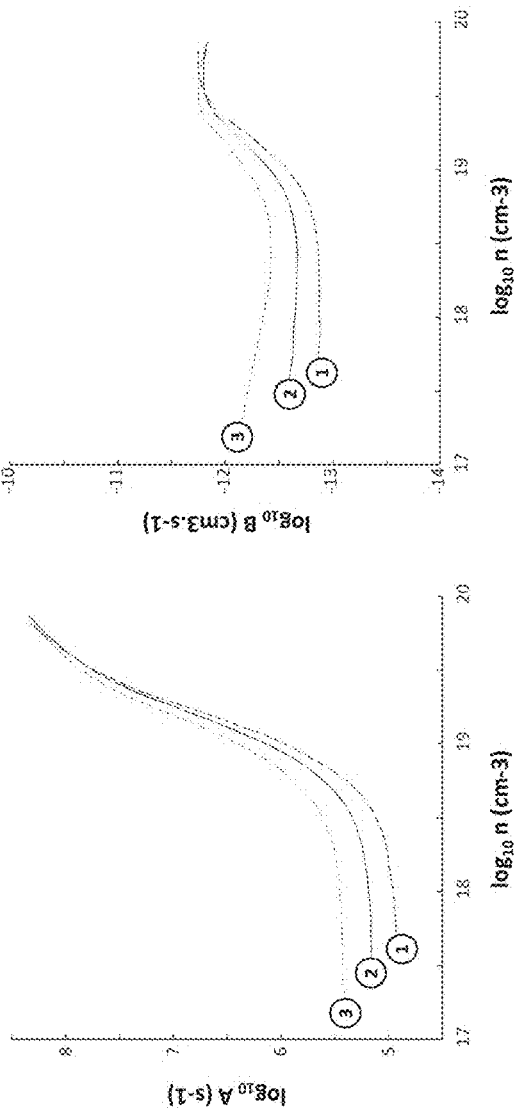
FIG. 13E
FIG. 13D

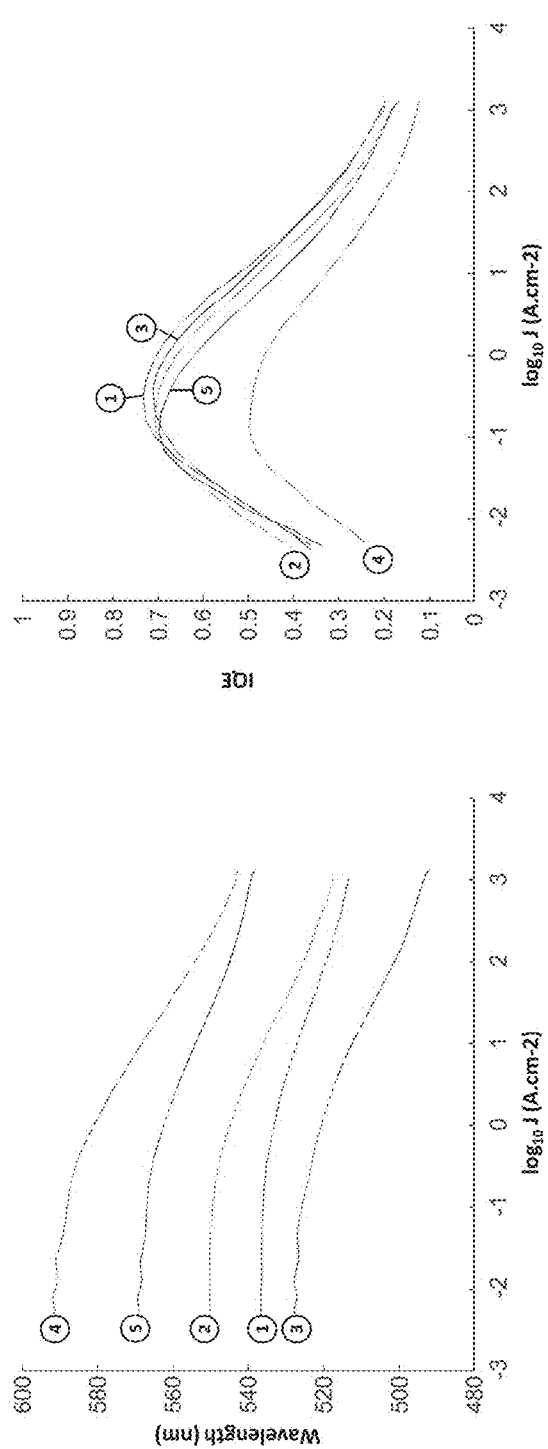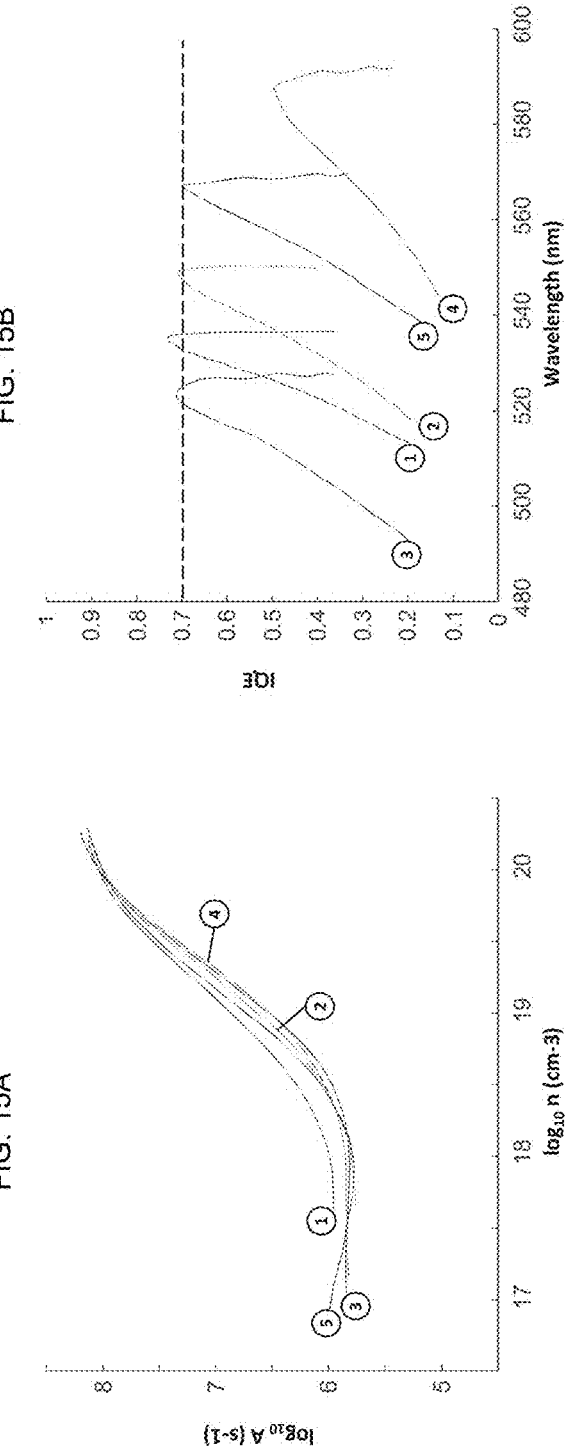
FIG. 15A
FIG. 15B
FIG. 15C
FIG. 15D

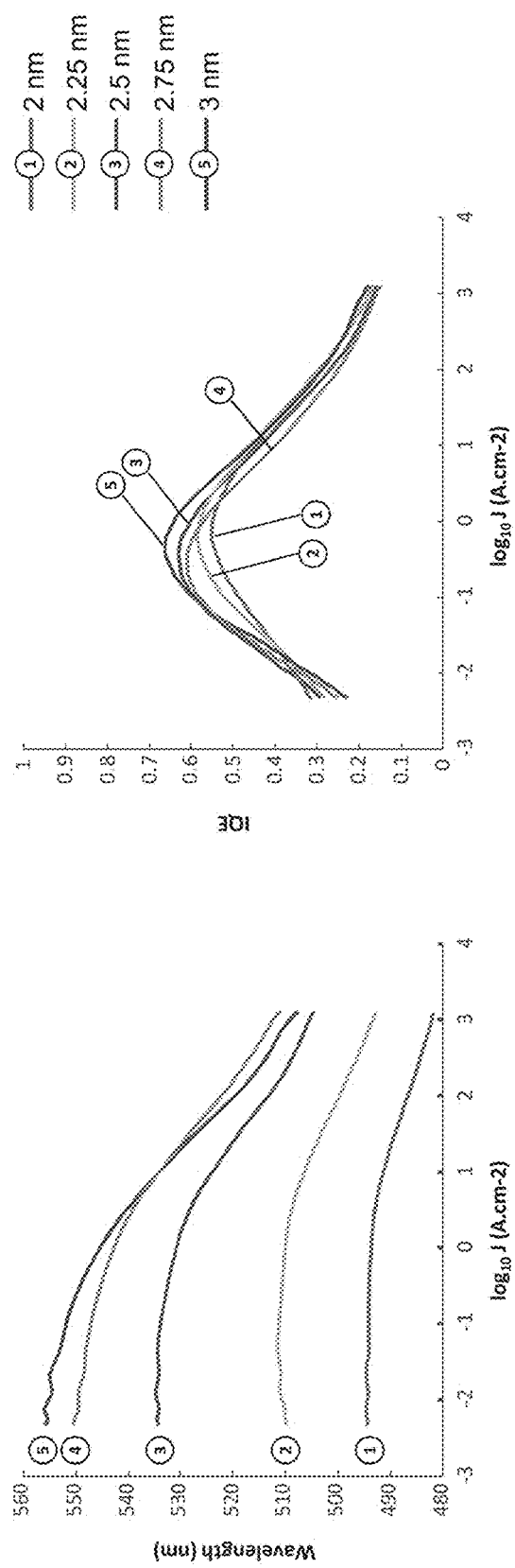
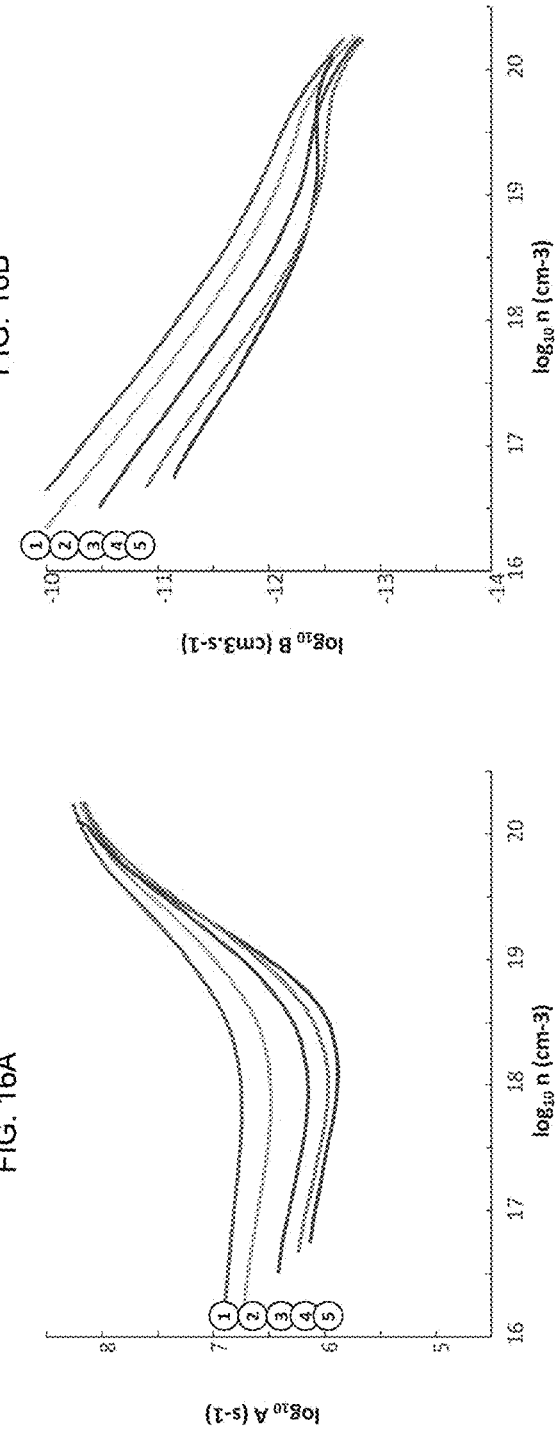
FIG. 16A  FIG. 16B  FIG. 16C  FIG. 16D

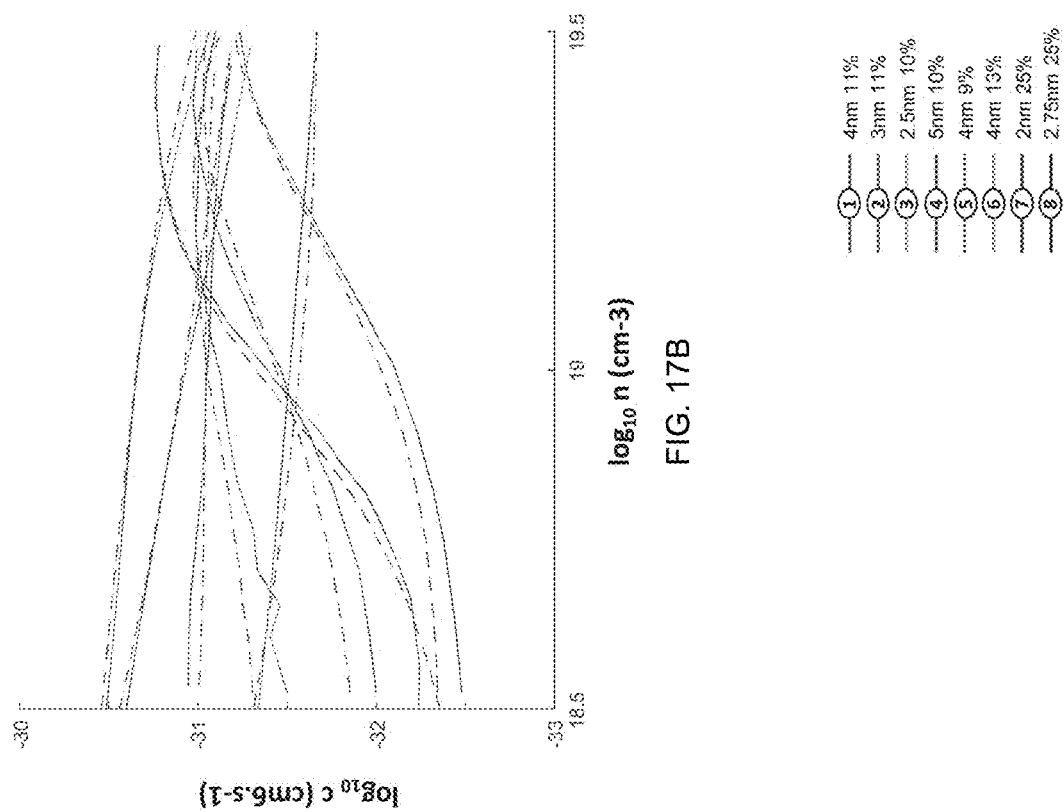
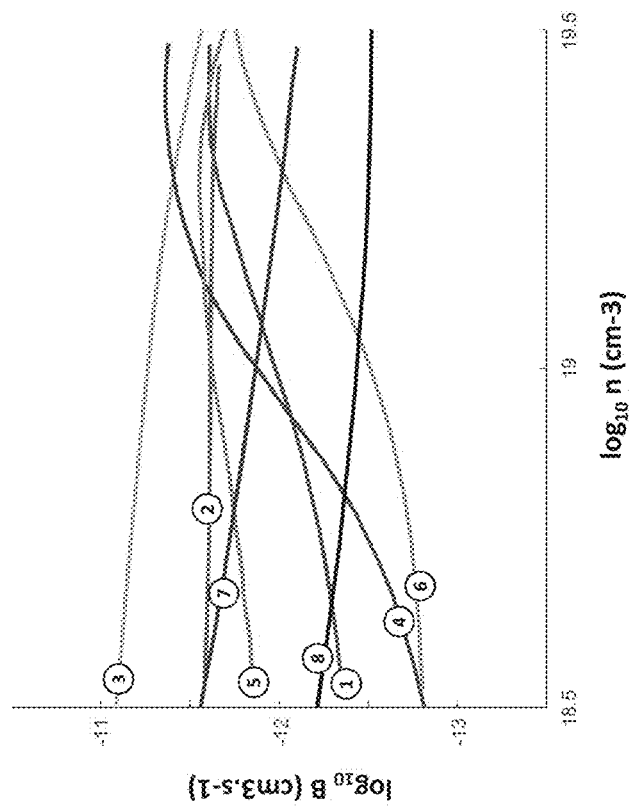
FIG. 17B
FIG. 17A

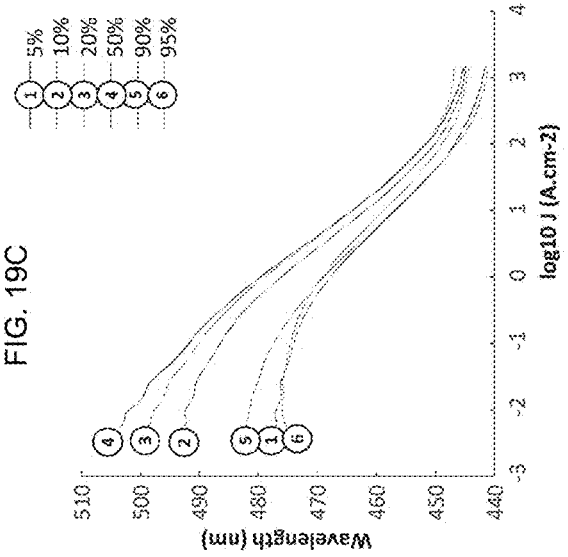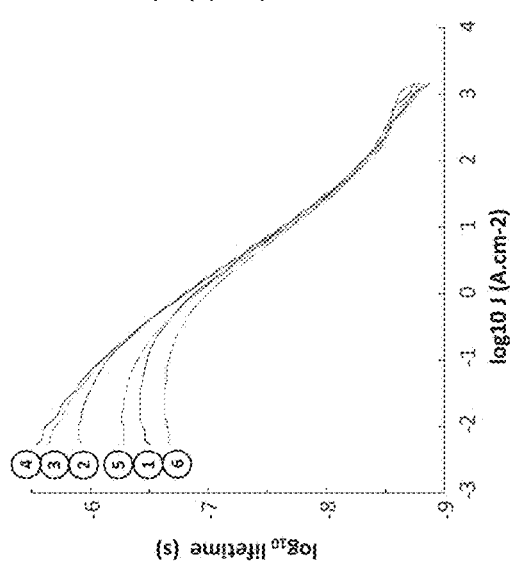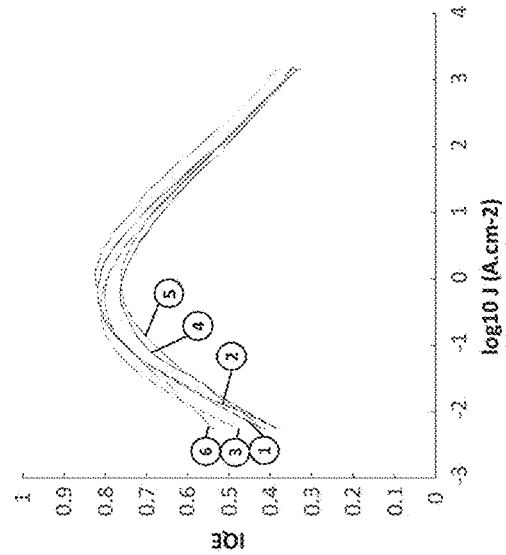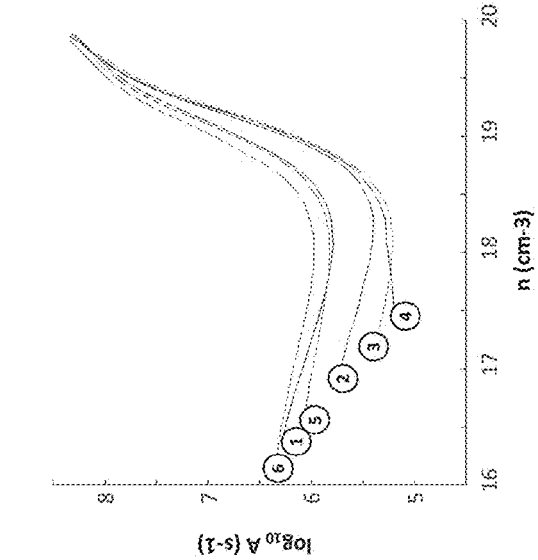
FIG. 19A  FIG. 19B  FIG. 19C  FIG. 19D  FIG. 19E  FIG. 19F

HIGH EFFICIENCY GROUP-III NITRIDE LIGHT EMITTING DIODE

REFERENCE TO RELATED APPLICATION

This application is based on U.S. Provisional Application No. 62/687,186, filed Jun. 19, 2018, which is hereby incorporated by reference.

FIELD OF INVENTION

The present invention relates generally to high efficiency light emitting diodes (LEDs), and, more specifically, to Group-III Nitride LEDs having high-efficiency at high current density.

BACKGROUND

Certain applications require III-Nitride LEDs to be efficient at high current density. This is challenging because of the phenomenon of efficiency droop, whereby the internal quantum efficiency (IQE) of a III-Nitride LED decreases at high current density.

By way of background, IQE is understood conventionally as a competition between three effects: (1) low-current nonradiative recombinations, (2) radiative recombinations, and (3) high-current nonradiative recombinations. Low-current nonradiative recombinations are widely understood to be induced by defects in the crystal, and to be a type of Shockley-Read-Hall (SRH) recombination. If n and p are the densities of electrons and holes in the active region, they can be expressed as $G\_SRH = 2\ Anp/(n+p)$. In the typical case where n=p, this is equivalent to $G\_SRH = An$. Radiative recombinations involve an electron and a hole, and can be expressed as $G\_Rad = Bnp = Bn^2$ (when n=p). High-current non-radiative recombinations are widely believed to be caused by Auger scattering, which can be expressed as $G\_droop = (c1\ n^2 p + c2\ np^2) = C\ n^3$. While others have proposed alternative models, in all embodiments, the droop current effectively scales with a high power of the carrier density (often with an exponent of 3, or more).

The IQE can be expressed as a combination of these different recombinations, i.e. $IQE = Bn^2/(An + Bn^2 + Cn^3)$. This is the well-known "ABC model." Often, coefficients A B and C are empirical and are chosen to match experimental data. The value of A, in particular, scales with the concentration of point defects. This modeling results in the well-known bell-shaped efficiency curve shown on FIG. 1. Although DAVID ET AL., *All-optical measurements of carrier dynamics in bulk-GaN LEDs: Beyond the ABC approximation*, Appl. Phys. Lett. 110, 253504 (2017) (David17) refines this model to better match experimental data, the model shares the same basic features—i.e., at low current, G_SRH dominates, at intermediate currents G_Rad dominates, and finally, at high current, G_droop dominates.

It is important to note that, in these proposed models, the nonradiative recombinations at low- and high-current density (respectively G_SRH and G_droop) are understood to be caused by distinct and unrelated physical phenomena. Low-current recombinations are caused by defects in the crystal (i.e. an extrinsic process), while high-current recombinations are caused by phenomena unrelated to defects (i.e., an intrinsic process). Accordingly, reducing G_SRH is believed to be a distinct challenge from reducing G_droop.

The independence of G_SRH and G_droop can be quantified numerically using the equations mentioned above. FIG. 2A shows modeled IQE using a basic ABC model for various values of A. The parameters are as follows: B=1.6e-13 cm3 s-1, C=3.16e-33 cm6 s-1, and A varies between 1E3 and 1E6 s-1. The values of B and C are representative of a 4 nm InGaN single quantum well (QW) with 13% In concentration. As A increases, the low-current efficiency and the peak efficiency decrease. However, the difference vanishes at high current density. For instance, at J=100 A·cm-2, all curves have the same IQE within +/−1% absolute—a very small variation. FIG. 2B further exemplifies the relative variation of IQE as a function of the relative defect density at 100 A·cm-2. Here, the baseline for relative comparison corresponds to the case A=1E6 s-1. When A is reduced tenfold, the relative IQE increases by less than 2%.

Although A could be high enough (for instance A=1E7) such that the high-current efficiency at 100 A·cm-2 would start to be impacted because SRH recombinations would become strong enough to be significant, this would correspond to a low-quality crystal having a low peak IQE (e.g. 30% for A=1E7). But for technologically-relevant devices, IQE>50% is desirable. Accordingly, the disclosure herein relates to the regime of sufficiently-good devices having sufficient crystal quality, where the effect of SRH recombinations is very small at high current density. In such crystals, the conventional understanding of IQE provides no motivation to improve high-current IQE by reducing point defects. This may correspond to LEDs having a peak IQE above 50% (or above 60%, 70%, 80%).

This understanding also applies to more sophisticated versions of the ABC model. For instance, [David17] showed that screening effects should be included in B and C (as will be further detailed later in this Application)—namely B and C are not strictly constant, but have a current dependence caused by screening. Including these screening effects slightly modifies the ABC model. For this improved ABC model, the influence of A on IQE is shown on FIG. 3. Screening effects change the high-efficiency shape of the IQE curve. However, even with an understanding of screening effects, the conventional belief that the effect of A on high-current IQE is very small remains.

This conventional belief also applies to different LED designs. For instance, increasing the In concentration can lead to lower values of A, B and C (which roughly scale together)—but the relative effect of A at high current density remains very small. Likewise, droop onset can be delayed by using thick active regions with more quantum wells. Here again however, SRH recombinations are believed to have little effect in the droop regime.

In summary, it is widely believed that the nonradiative recombinations at low-current density and high-current density are caused by distinct and unrelated physical phenomena—namely, low-current recombinations are caused by defects in the crystal (extrinsic process), whereas high-current recombinations are caused by phenomena unrelated to defects (intrinsic process). Thus, according to the conventional understanding, for a sufficiently good LED, a large variation in defect density translates into a very small improvement in high-current-density IQE. For example, a substantial 10× reduction in defect density causes less than 2% absolute (or 5% relative) increase in IQE at 100 A·cm-2. Accordingly, efforts to improve the efficiency of a III-Nitride LEDs at high current density and avoid current droop have been focused on other strategies, such as increasing the thickness of the active region and improving the carrier spreading across the active region. These approaches have been met with limited success. Therefore, the need to improve the efficiency of a III-Nitride LEDs at high current density remains. The present invention fulfills this need, among others.

SUMMARY

The following presents a simplified summary of the invention to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

Applicants discovered surprisingly that, contrary to conventional theory, current droop/high-current recombinations are caused, in part, by phenomena related to defects. In other words, current droop of LEDs at high current density is not governed by intrinsic processes alone. Rather, current droop is caused by a combination of several processes—the first process is intrinsic, whereas the second is extrinsic and increases with the presence of point defects. The extrinsic process tends to scale linearly with the amount of point defects. Conventional theories ignore the interaction between these distinct processes, and therefore ignore an important factor in improving high-current efficiency of LEDs by reducing defects.

Applicants have determined that in some embodiments, by reducing defects by a factor of f, high-current density IQE is increased by $-0.1*\ln(f)$, at 100 A·cm-2. This sensitivity to f is much larger than would be expected according to the conventional understanding. Therefore, unlike conventional approaches, the present invention improves the high-current efficiency of a III-Nitride LED by reducing its defect density. For the sake of clarity, f=0.5 means that the defect density is reduced by half.

Applicants not only discovered unexpectedly that a reduction in defects increases substantially the efficiency at high current density, but also provide a method of using this discovery to develop new high efficiency LEDs. In one embodiment, the method involves an iterative process of reducing defects and testing efficiency to the point of diminishing returns in the efficiency improvement. Accordingly, in one embodiment, the present invention involves a method of improving high-current density efficiency of an LED comprising: (a) preparing a series of LEDs having decreasing defect densities, wherein each LED of the series has a peak IQE of at least 50%, and wherein each LED of the series has the same epitaxial structure; (b) determining an increase in IQEs at high-current density between at least two LEDs of the series; (c) preparing at least an additional LED of the series by reducing defect density relative to the previously obtained lowest defect density; and (d) reiterating steps (b) and (c) until the increase is at least 3% between two LEDs of the series having a decrease in defect densities.

In another embodiment, the invention relates to a method comprising: (a) preparing a series of LEDs having decreasing defect densities, wherein each LED of said series has an IQE at a low current density, J_low, and wherein each LED of said series has substantially the same epitaxial structure; (b) determining an increase in IQEs at J_low between at least two LEDs of said series; (c) preparing at least an additional LED of said series by reducing defect density relative to the previously obtained lowest defect density; and (d) reiterating steps (b) and (c) until said increase is at least 10% between two LEDs of said series having a decrease X in defect densities, wherein said increase corresponds to an increase in IQE at high current density of more than 3%.

In yet another embodiment, the invention relates to a method comprising: (a) determining a desired improvement in high-current density IQEs (A IQE) between a starting LED and a target LED; (b) determining the factor of reduction of defect density (f) required to achieving said A IQE according the following $f=e^{(-\Delta IQE/k)}$, where k is in the range 0.05-0.15 or in the range 0.03-0.2; and (c) causing the reduction in defect density in said starting LED by f to form said target LED.

In still another embodiment, the invention relates to a method of improving high current efficiency compared to a first LED having an intrinsic defect density of X and having a first IQE at 100 A·cm-1 greater than 50%, said method comprising: (a) preparing a second LED, which is the same as said first LED except said second LED has a defect density less than X/2; (b) testing said second LED to determine a second IQE at 100 A·cm-1; and (c) wherein said second IQE is at least 3% more than said first IQE.

Yet another embodiment is a method of designing a high-current density LED having an active region, said method comprising: (a) determining the efficiency of a first LED, wherein said first LED has a first efficiency profile characterized by $B1*n^2/(A1*n+B1*n^2+c1*n^3)$, wherein n is an electron density in an active region of said first LED material, and A1, B1, and c1 are empirically-derived coefficients, wherein said first LED has a first peak IQE greater than 50%; (b) reducing intrinsic defects in said first LED to obtain a second LED; and (c) determining the efficiency of said second LED, wherein said second LED has a second efficiency profile characterized by $B2*n^2/(A2*n+B2*n^2+c2*n^3)$, wherein n is an electron density in an active region of said second LED, and A2, B2, and c2 are empirically-derived coefficients, wherein c2<c1.

Still another embodiment is a device comprising: (a) a LED having a light emitting active region for emitting light having a wavelength longer than X, said LED having an SRH lifetime longer than Y, and an IQE higher than Z at a current density above 10 A·cm-2; and (b) wherein X is 500 nm, Y is 10 μs, and Z is 50%.

A further embodiment involves a device comprising: a III-Nitride LED having a light-emitting region characterized by an emission wavelength longer than 550 nm, and having recombination coefficients A, B, c with AB less than 5E18 cm³ and c/B less than 5E-19 cm⁻³, and a peak IQE above 40%/

Yet another embodiment involves a device comprising a III-Nitride LED characterized by an emission wavelength longer than 550 nm, an active region concentration of In no less than 25%, a peak IQE above 40%, a carrier density n, and recombination coefficients A, B(n), c(n), wherein c(n) is proportional to B(n)q, wherein q is at least 1.0.

Another embodiment is a method of promoting a LED, said method comprising: (a) developing an improved LED having a lower defect density than an existing LED; and (b) indicating to potential buyers that said improved LED has higher efficiency at high current density than said LED.

SUMMARY OF FIGURES

FIGS. 11A-11B show experimental evidence of the coupling between point defects and droop for QWs with a higher In composition.

FIGS. 13A-13F show experimental evidence of the effect of polarization field (driven by wavelength/composition) on various recombination parameters.

FIGS. 15A-15D show data for some samples shown in FIG. 14, having varying composition/wavelength.

FIGS. 16A-16F show how long-wavelength performance can further be influenced by the design of the active region—i.e., the thickness of the SQW.

FIG. 17A shows the experimental coefficient B for a series of SQW samples having various QW structures (thickness and composition, as indicated FIG. 17B shows the corresponding values of c, as full lines.

FIGS. 19A-19F show an example of a series of QWs with modulation doping.

DETAILED DESCRIPTION

Figure 10:
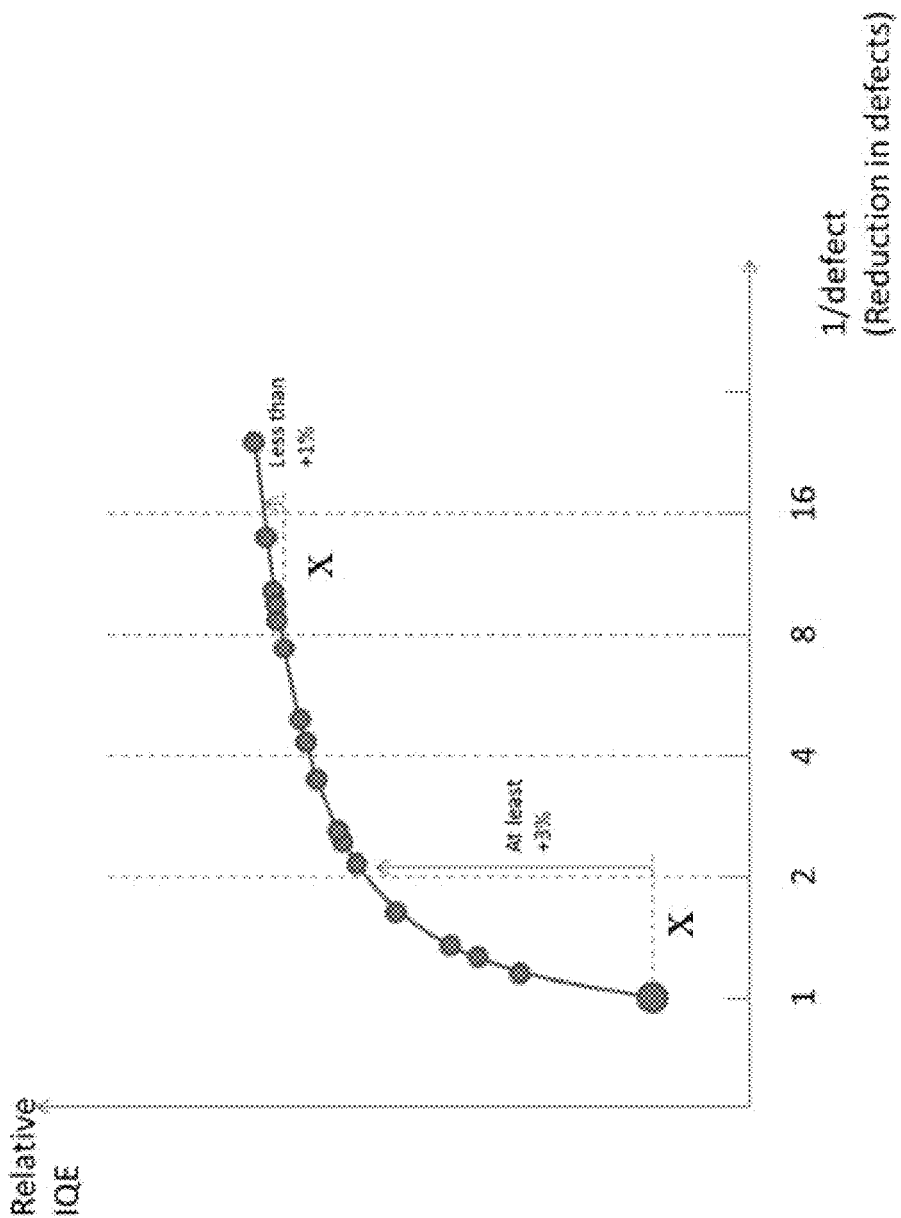
FIG. 10 shows a prophetic example of an iterative process of increasing IQE at high current density through reductions in defect density.

Referring to FIG. 10, in one embodiment, the present invention relates to an iterative process of producing LEDs having high efficiency at high current density. In this embodiment, the process comprises: (a) preparing a series of LEDs having decreasing defect densities, wherein each LED of the series has a peak IQE of at least 50%, and wherein each LED of the series has the same epitaxial structure; (b) determining an increase in IQEs at high-current density between at least two LEDs of the series; (c) preparing at least an additional LED of the series by reducing defect density relative to the previously obtained lowest defect density; and (d) reiterating steps (b) and (c) until the increase is at least 3% between two LEDs of the series having a decrease X in defect densities. In one embodiment, the process further comprises: (e) reiterating steps (b) and (c) until the increase in IQE at high current density between two LEDs in the series having a decrease in defect densities of at least the X is less than 1%. In some embodiments, X is 50% (i.e. the defect density is reduced by half).

Unless otherwise indicated, as used herein, a relative increase is measured as [higher value−lower value]/lower value and a relative decrease is measured as [higher value−lower value]/higher value.

As used herein unless otherwise stated, the meaning of high current density is understood in the art to depend on the device being tested. Traditionally, high current density is understood as the current range where SRH recombinations have a small contribution to the IQE. In this respect, unless otherwise stated, high current density corresponds to the current range at which less than 5% of the recombinations are cause by SRH recombinations. For example, in a blue LED with a peak IQE of about 50%, this corresponds typically to a current density of greater than about 200 A·cm-2, and, in a blue LED with a peak IQE of about 80%, this corresponds to a current density of greater than about 2 A·cm-2. Likewise, the term "low current density" means a current density at which most recombinations are caused by low-current recombinations, for instance, wherein at least 95% of recombinations are non-radiative (i.e. the IQE is less than 5%). This may correspond to about J=1E-3 cm-1 (or 1E-4 A·cm-2, 1E-5 A·cm-2, 1E-6 A·cm-2, 1e-2 A·cm-2, 1E-1 A·cm-2), again, depending on the structure.

As used herein, "substantially same epitaxial structure" refers to the epitaxial layers among different LEDs being substantially the same. It should be noted that the epitaxial structures between two LEDs need not be exactly the same to be substantially the same. For instance, in LEDs having the substantially same epitaxial structure, the epitaxial layers may remain unchanged except that the doping or thickness of a layer is modified, but this change is insubstantial in that one skilled in the art would know that this change does not affect the IQE of the LED significantly (i.e., by more than 1%). As a specific example, slightly varying the doping or thickness of an n-layer or p-layer generally does not change the active region IQE. Thus, two LEDs with only variations in n-layer doping would have substantially similar epitaxial structure. In this disclosure, such structures are called "substantially the same epitaxial structures." Importantly, aside from such small changes in the epi structure, the defect density may also be varied to improve the IQE, as taught herein. Accordingly, in some embodiments, the defect density is reduced across a series of LEDs with substantially the same epitaxial structure.

As used herein, the term "defect" broadly describes a crystal imperfection (i.e., a departure from the ideal crystal lattice) which can cause nonradiative recombinations. This includes point defect and extended defects. Point defects can be impurities added to the crystal, such as an atom integrated in the lattice (either instead of a crystal atom, or as an interstitial, or as a complex). Examples of atoms which may act as defects include C, O, Mg, Fe, B, Sb, Cu, and various other atoms (including metals). Alternatively, point defects may be formed in the absence of an impurity and may be caused by an interstitial, a vacancy, or a complex involving the atoms forming a III-Nitride LED (including Ga, N, In and Al). Point defects may also be extended defects, such as dislocations (threading or screw type) and misfits. Other defects can be envisioned to cause SRH recombinations, for instance combinations of the above defects (such as complex of a vacancy and an impurity, etc). In some embodiments, several defects contribute to non-radiative recombinations. In some embodiments, a defect causing non-radiative recombination is one of: C, O, Mg, Fe, B, Sb, Cu, a Ga-vacancy, a N-vacancy, a Ga-complex, a N-complex.

In the context of this Disclosure, it should be understood that defect does not pertain to all defects in the LED. Some defects may not cause SRH recombinations and/or cause extrinsic droop. Accordingly, defect as used herein pertains to those which cause SRH recombinations and extrinsic droop. In some cases, such defects have energy levels which are inside the bandgap of the LED; in some cases these levels are close to the center of the bandgap, because such levels can cause faster recombination rates; these levels may be near the center of the bandgap +/−0.5 eV (or +/−1 eV); they may be located more than 0.5 eV (or more than 1 eV) away from both the conduction band edge and the valence band edge of the active region.

The concentration of a defect, or defect density, may be understood as the concentration in the active region. This definition admits some slight variations depending on the structured considered. For instance, it may be the concentration in a given QW, or the average concentration over several QW (such as, all the QW making the active region), or the concentration at one point of a QW (such as near the middle of the QW), or the concentration at an interface (such as a QW/barrier interface), or the concentration averaged over several QWs and barriers (such as the concentration averaged over the whole active region). This also holds true for actives layers which are thick and are sometimes not called quantum wells (for instance double heterostructures). It could be a Volumatic concentration (in cm-3, for instance for point defects) or an area concentration (in cm-2, for instance for dislocations), or a linear dislocation (in cm-1, for instance for misfit dislocations).

As used herein unless otherwise indicated, "defect density" need not be measured on an absolute scale—nor is it necessary to identify a specific defect in order to practice the teachings of the invention. Rather, a relative measure of defect density compared to other LEDs prepared in the series may be quantified indirectly.

For example, defect density can be quantified by the inverse of the low-current non-radiative lifetime, a measurable quantity. The low-current non-radiative lifetime is also often called the SRH lifetime. It can be measured by a variety of time-resolved measurements. This includes the all-optical differential lifetime measurement which will be described further. Other techniques are known, such as the time decay of the LED's luminescence in response to an ultrafast laser pulse (the low-power tail of this response typically has a mono-exponential behavior governed by the SRH lifetime); or differential lifetime measurements under electroluminescence injection. In the latter case, care should be taken to properly account for electrical injection effects, so that an accurate SRH lifetime is derived—this is described in DAVID ET AL. *Carrier dynamics and Coulomb-enhanced capture in III-nitride quantum heterostructures*, Applied Physics Letters 109, 033504 (2016) (David16). Regardless of the technique, the SRH lifetime is inversely proportional to the defect density, so that a 2× increase in lifetime indicates a 2× reduction in defect density. Therefore, in one embodiment, the defect density is reduced such that the SRH lifetime is increased by 2× (in comparison to an initial LED) and this leads to an increase of IQE at a high current density of more than 3%.

In other embodiments, a relative variation in defect density is inferred from the low-current shape of the efficiency curve. At low current, the efficiency is proportional to $B \cdot n/A$ (this is the limit of the ABC model at low current). In comparing two LEDs, one may make the approximation that a constant current density J corresponds to a constant carrier density n (which is warranted for small changes in IQE). Therefore, one may compare the IQEs of the two LEDs at the same low current density, which is proportional to $1/A$. Hence, a 2× increase in low-current IQE is indicative of a 2× reduction in defect density.

Recombination rate G and current density J are connected by $J=G*eV*t$, where t is the thickness of the active region. This is valid for the total recombination (radiative+nonradiative) as well as for individual channels. The carrier density n is related to the recombination rate by $n=\text{sum}(\tau \cdot dG)$, where sum( ) is an integral. These expressions apply to a simple case with a single-layer active region having a well-defined thickness and equal electron and hole densities. However, one skilled in the art will understand that the present teachings are easily generalized to more complex structures, for instance having multiple quantum wells and uneven carrier spreading across the active region.

The droop rate is described herein as caused by a current scaling with $n^3$. This is compatible with Auger scattering. However, it is not necessary to adopt this interpretation to appreciate the teachings of this invention. Any non-radiative process having faster carrier-dependence than radiative recombination may cause droop. Regardless of what phenomenon is believed to cause such a droop current, one would not expect point defects to have a significant impact at high current density. Thus, Applicants' discovery is surprising regardless of a specific interpretation of droop.

Reducing Defects

In one embodiment, a series of LEDs having reduced defects is produced. Defects can be reduced in a variety of ways. In some embodiments, defect reduction is achieved by optimizing/improving the reactor conditions. For instance, a specific impurity is selected and the reactor is modified to reduce for presence of this impurity. This could consist in changing the gas lines of a reactor to reduce the presence of a deleterious species, including metallic atom. Alternatively, it may involve changing the geometry of the reactor to reduce the residual presence of a species (such as Mg), which can sometimes linger in a reactor. It may involve cleaning, replacing or changing part of the reactor's hardware and selecting proper materials (in some embodiments, quartz or SiC or a metal). In some embodiments, defect reduction is achieved by purging a chamber of the reactor with a desired gas, or by applying a desired temperature (such as a high temperature above 1000 C) to a reactor chamber. The term reactor is used to describe an apparatus used to form a crystal. It may be an MOCVD reactor, an MBE reactor, an HVPE reactor, but also a different tool such as a sputtering tool.

In some embodiments the LED is formed on a bulk GaN or bulk III-Nitride substrate. The substrate may have polar, non-polar or semi-polar orientation. In some embodiments the LED has a low density of dislocations (for instance less than 1E7 cm-2 or 5e6 cm-2 or 1e6 cm-2 or 1e5 cm-2 or 1e4 cm-2). In some cases, the low dislocation density helps reduce the defect density, or helps prevent the incorporation of a defect. In some embodiments the LED is formed on a substrate having a lattice constant substantially matched to GaN, or to an AlInGaN compound, or to InGaN with an indium concentration of about 10% (or 3%, 5%, 7%, 13%, 15%, 17%, 20% or above 3% or above 5%). Substantially matched mean that the lattice constant of the two crystals are close to each other, for instance they are within +/−0.1% (or +/−1% or +/−0.5% or +/−0.05% or +/−0.01%). In some cases, the substrate does not such have such a lattice-matching property, but nonetheless enables the nucleation of a III-Nitride layer having such a lattice-matching property.

In some embodiments, defect reduction is achieved by configuring the semiconductor with alternative layers. For instance, an underlayer (such as a superlattice or a bulk underlayer) may be grown under the active region to getter defects. The underlayer may comprise, for example, layers of AlInGaN. It may be an InGaN/GaN superlattice or more generally an AlInGaN/AlInGaN superlattice. Alternatively, layers may be grown in or around the active region to getter defects—e.g. "dummy" quantum wells having a different composition than the light-emitting quantum wells. In some embodiments, the underlayer has a sufficient total quantity of indium. For instance, the cumulative product of the underlayer's indium composition (in percent) and its thickness (in nm) is at least 500 (or 100, 250, 750, 1000). For clarity, a cumulative product of 500 may for instance be achieved with a bulk InGaN layer having thickness of 200 nm and an In composition of 2.5%, or with a superlattice having InGaN layers with a composition of 5% and a cumulative thickness of 100 nm. In samples where the underlayer composition is not constant, this quantity can be computed as a numerical integral of the In profile versus position. In some embodiments, the In content of In-containing layers in the underlayer structure is at least 7% (or 5%, 8%, 9%, 10%, or 15%).

In some embodiments, defect reduction is achieved by modifying growth conditions such as gas flows, pressure, temperature (including surface temperature of the wafer), growth rate, precursor flows, partial pressure of group III species, partial pressure of group V species, III/V ratio, In gas phase ratio (against total gas phase, e.g. Ga+In). In some embodiments, at least a portion of the following values are used, either alone or in combination: pressure of at least 600 Torr (or 700 Torr); growth temperature of one or several layers or all layers below the active region of less than 800 C (or less than 850 C, or less than 750 C); growth temperature of underlayer of less than 820 C (or 800 C, or 750 C); Growth temperature of active layers in a range 700-850 C (or 650-800 C, or 650-750 C); at least one GaN layer in the active region with a growth temperature in a range 1100-1100 C; growth of all layers above the active region with a temperature below 900 C (or 850 C, or 800 C, or 700 C); active region growth rate below 0.5 A/s (or 0.7 A/s, or 0.3 A/s, or 0.2 A/s, or 0.1 A/s); active region barrier growth rate below 0.5 A/s (or 1 A/s); V/III ratio above 50,000 or 100,000 or 200,000; V/TEG ratio above 50,000 or 100,000 or 200,000; In/total molar gas phase ratio of at least 0.6 (or 0.5, or 0.7, or 0.8); NH3 flow in a range 1-100 (or 1-10 or 10-100) L/min; TEG flow in a range 3-300 (or 3-30 or 30-300) umol/min. In some embodiments, all the layers grown below the active region are grown at a temperature lower than the highest growth temperature of layers above the active region. In some embodiments, all the layers grown below the active region are grown at a temperature no greater than the growth temperature of the active region, or all the layers below the active region are grown at a temperature less than 20 C (or 50 C, or 100 C) the growth temperature of the active region. Those of skill in the art will understand how to modify process conditions to optimize semiconductor growth and minimize the defect formation. In some embodiments, a surfactant or anti-surfactant is introduced in the reactor to reduce defect incorporation. Such surfactants may include, for example, Si or In or Al or Ge.

In some embodiments, defect reduction is achieved by controlling the Fermi level or the electron and hole quasi-Fermi levels during growth. This may be achieved by incorporating in the crystal a species which shifts the Fermi level (such as a donor or an acceptor). This may be achieved by flowing during growth a surfactant which modifies the Fermi level without being incorporated. This may be achieved by illuminating the wafer with appropriate wavelength and intensity during growth to create electron and hole populations. In some embodiments the (quasi-)Fermi level is modified by at least 0.1 eV (or 1 eV) from the value it would have before the improvement was applied. In some embodiments, this is important because the (quasi-)Fermi level may determine the defect density (for instance, a given defect which causes non-radiative recombinations may form more easily in n-typed material or in p-type material); even when a layer is nominally undoped, there is often a residual doping by background impurities which shifts the Fermi level, and correcting for this may be desirable.

In a specific example, in an initial LED, the active region is grown under nominally undoped conditions; however, impurities are present which cause the Fermi level to shift towards the valence band, thus causing the preferential incorporation of a deleterious point defect; to correct for this, in some embodiments, a desired species is flown (such as Si, Ge, O) which shifts the Fermi level back towards the conduction band and reduces the point defect incorporation. It should be appreciated that this can be achieved even if the concentration of the desired species is very small, since even a small concentration can cause a very large swing in Fermi level.

In some embodiments, the desired species has a concentration in a layer of the LED of about 1E13 cm-3 (or 1E14 cm-3, 1E15 cm-3, 1E16 cm-3, 1E17 cm-3, 1E18 cm-3) or in a range 1E14-1e17 cm-3 or 1E13-1E15 cm-3. In some case, the desired species has a concentration sufficient to shift the Fermi level by more than 1 eV (or 0.5 eV, 2 eV). In some embodiments, the desired species has a concentration sufficient to shift the Fermi to within 1 eV (or 0.5 eV, 0.2 eV, 0.1 eV) of the conduction band edge (or the valence band edge). The Fermi level control may be performed in a variety of layers in the LED, including the whole LED or the active region or layers under the active region.

Observing Improved Efficiency

As LEDs with lower defects are produced, higher efficiency at high current density is observed. The IQE is the ratio of carriers that recombine to carriers injected in the active region. For clarity, the wall-plug efficiency of an LED can be written as WPE=15*IQE*Cex, where 15 is the injection efficiency (describing the probability that carriers reach the active region and remain there) and Cex is the light extraction efficiency. In some embodiments, the increase in IQE leads to an increase in WPE. Unless otherwise mentioned, quantities are expressed at room temperature (25 C). However, the teachings of this invention apply at other temperatures, such as typical operating temperatures (e.g. 60 C, 85 C, 120 C, etc.).

In one embodiment, the defect density is reduced such that the IQE is doubled at J=1E-3 A·cm-2, and this leads to an increase of IQE at high current density (or at 100 A·cm-2) of more than 3%, 5%, 7%, 15%, 20%. In one embodiment, an initial LED is obtained, whose IQE is 5% at a low-current density J_low, then an improved LED is obtained with a reduced defect density such that the IQE at J_low is at least 10%, which leads to an increase of IQE at high current density of more than 3%.

In some embodiments, a reduction by 2× in defects causes a relative IQE increase of about 7% at 100 A·cm-2. More generally, a reduction in defect density by a factor of f (with f<1) leads to a relative IQE increase approximately given by: −0.1*ln(f), at 100 A·cm-2, as observed in the experiments described below. Applicants expect that the order of magnitude of the IQE increase may vary with other factors (including the details of the active region, its wavelength, etc.). Therefore, in other embodiments, the relative IQE improvement is approximately given by −k*ln(f) where k is in the range 0.05-0.15 or in the range 0.03-0.2. For the sake of clarify, the relative IQE improvement is calculated from the IQE of the improved crystal (embodiment) divided by the IQE of the original crystal (prior art); for instance, the original crystal has an IQE of 50%, the improved crystal has an IQE of 55% and the relative gain is +10%. Such improvements at high current density are non-trivial: a defect reduction by a factor of 2 may cause a relative IQE increase of 3% or more, whereas at high current density one would expect a much lower improvement.

In some embodiments, the two quantities (i.e. relative defect density and IQE) are approximately related as shown in Table 1 below. J may be a current density in which the effect of SRH recombinations is small, for example, 100 A·cm-2 (or 50 A·cm-2, 200 A·cm-2, 500 A·cm-2, 1 kA·cm-2).

TABLE 1

| Defect density (relative) | IQE (absolute) at current density J | IQE (relative) at current density J |
|---|---|---|
| 1 (prior art) | 50% | 100% |
| 0.5 | 53% | 107% |
| 0.1 | 62% | 123% |
| 0.05 | 65% | 130% |
| 0.01 | 73% | 146% |

These figures evidence a much larger coupling between defects and droop than would be expected from the prior art, again illustrating the unexpected result of this invention.

In some embodiments, defect reduction is quantified by the non-radiative coefficient A (which is the inverse of the low-current non-radiative lifetime, a measurable quantity). A typical lifetime for a conventional LED may be about 10 ns or 100 ns. However, lifetime of the low defect LEDs of the present invention is considerably longer. For example, in one or more embodiments, the lifetime is longer than 1 µs, 10 µs, 100 µs, or 1 ms.

In an embodiment, a method is used to decrease A by at least a factor of 2 (or 5, 10). In an embodiment, a decrease of A by a factor of 5 leads to an absolute IQE increase of about 5% (or 3%, 7%) at 100 A·cm-2, or to a relative IQE increase of about 10% (or 6%, 14%). In an embodiment, a decrease of A by a factor of ten leads to an absolute IQE increase of about 10% (or 6%, 14%) at 100 A·cm-2, or to a relative IQE increase of about 20% (or 12%, 28%). In some embodiments, the reduction is substantially linear—therefore a reduction by 5× in the defect density (i.e. in the value of A) results in a reduction of about 5× (or at least 3×) in the droop current (i.e. in the value of (C+D), as will be discussed later).

Generally, the process of altering the production of the semiconductor to produce LEDs with lower and lower defect densities may be carried on until diminishing returns are realized in the improvement of efficiency. What constitutes a diminishing return will be based upon the user and the economies of preparing new, lower defect, LEDs. For example, Applicants found, in one embodiment, that an IQE improvement of less than 1 or 2% at high current density no longer warranted additional effort in lowering defect density. Accordingly, in the iterative process described above, Applicants stopped once decreasing defects by 2× led to a relative IQE increase less than 2%. It should be understood that this depends on the economies of the user's process and manufacturing LEDs.

Product from Process

The process of one or more embodiments of the present invention results in LEDs having improved efficiency at high current density. In some embodiments the improved crystals, when compared to previously-grown crystals, are characterized by a lower defect density, a lower droop current, and a higher IQE at high current density. In embodiments, the reduction in the defect density causes the reduction in the droop current and the improved IQE. In some embodiments, the LED is operated at a high current density with improved IQE and reduced droop.

In some embodiments, the crystal is of high quality, such that SRH recombinations have small influence at high current density. For instance, at a current density of 100 A·cm-2 (or 50 A·cm-2, 200 A·cm-2), J SRH (SRH current density) contributes to less than 1% (or 5%, 3%, 0.5%, 0.1%) of J (total current density). In some embodiments, the crystal is of high quality and has a high peak IQE of at least 50% (or 40%, 60%, 70%, 80%). Yet, these crystals benefit from defect reduction because the defect reduction also reduces the droop current.

In some embodiments, high-current nonradiative recombinations (i.e. the droop current) are predominantly caused by the sum of two currents: an intrinsic current and an extrinsic current. In some embodiments, neither current is caused by SRH recombinations. In some embodiments, the extrinsic current scales with the concentration of a point defect.

In other embodiments, a reduction in defect density leads to an unexpected IQE increase at high carrier density (a quantity related to current density).

In some embodiments, the invention applies to laser diodes (LDs) rather than to LEDs. Indeed, the Auger current can be very strong in a LD below threshold, which negatively impacts threshold. In some embodiments, the defect density in a laser diode is decreased as described elsewhere in the Application. This leads to a reduction in the droop current, and accordingly to a decreased in the threshold current. In some embodiments, a method is used to produce a series of LDs with decreasing defect density and decreasing threshold current. The defect density is reduced by at least 2×, leading to a reduction in SRH recombinations by at least 2×, and to a reduction in threshold current by at least 10% (or 20%, 30%, 50%, 80%) or to a reduction in threshold current density by at least 1 kA·cm-2 (or 0.5 kA·cm-2, 2 kA·cm-2). As is the case for LEDs, such improvements are not expected according to the prior art, because the impact of SRH recombinations on threshold current is believed to be negligible. Other defect-related improvements can lead to the same reduction in threshold current densities.

Example 1—Exploring Recombinations

Figure 4:
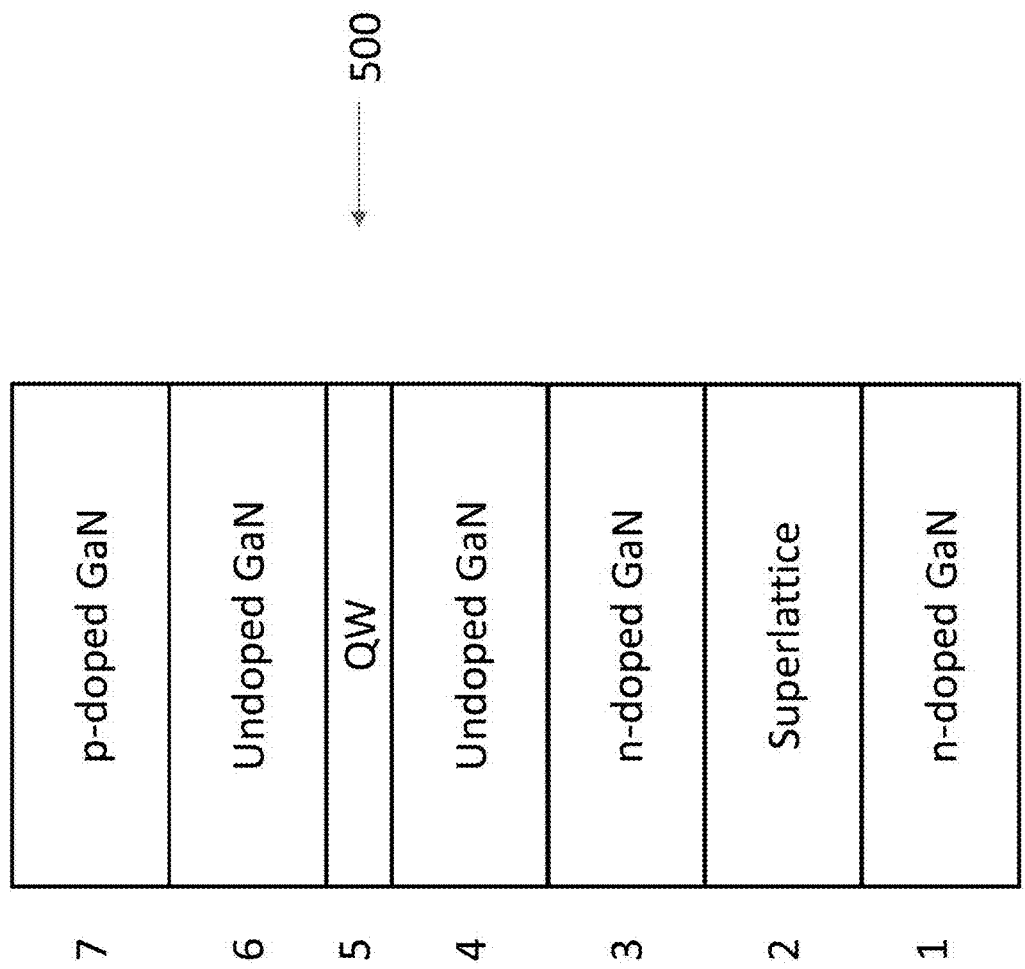
FIG. 4 shows an epitaxial structure used in all-optical differential lifetime photoluminescence measurements.

We first review how recombination rates can be explicitly measured experimentally. We use an all-optical differential lifetime (ODL) photoluminescence measurement described in [David17]. Measurements were carried out on the following sample, whose structure is shown on FIG. 4: a single InGaN QW (4 nm thick, 11% In) at the center of a 200 nm-thick GaN p-i-n diode. A superlattice (SL) is included below the pin region to reduce defect density.

Figure 5A:
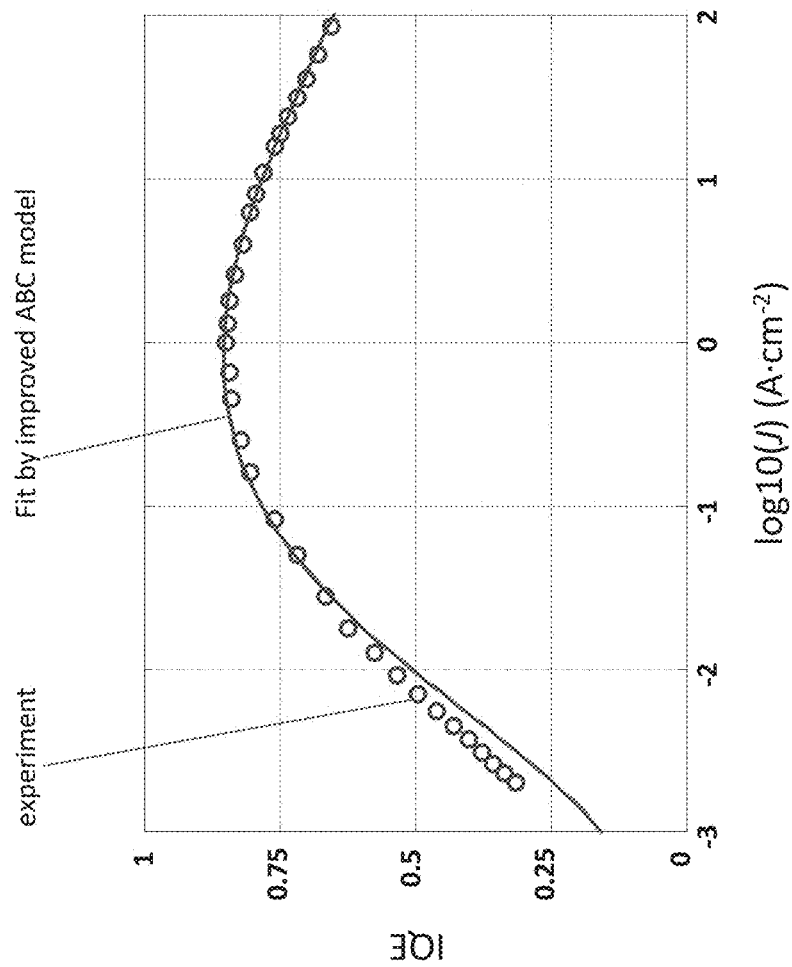
FIG. 5A shows IQE as a function of current density (J).

FIG. 5A shows the experimental IQE of this sample measured in a photoluminescence experiment. The current density J is the current density optically-induced in the active region by the exciting laser, and it can directly be compared to an electrical current density (which would be the equivalent quantity in the case of electrical injection).

An ODL measurement was performed on this sample. The ODL method enables the determination of the radiative current (G_Rad) and non-radiative current (G_NR), of the carrier lifetime t, and of the carrier density n in the active region. G_NR comprises a low-current and a high-current component: G_NR=G_SRH+G_droop.

Figure 3:
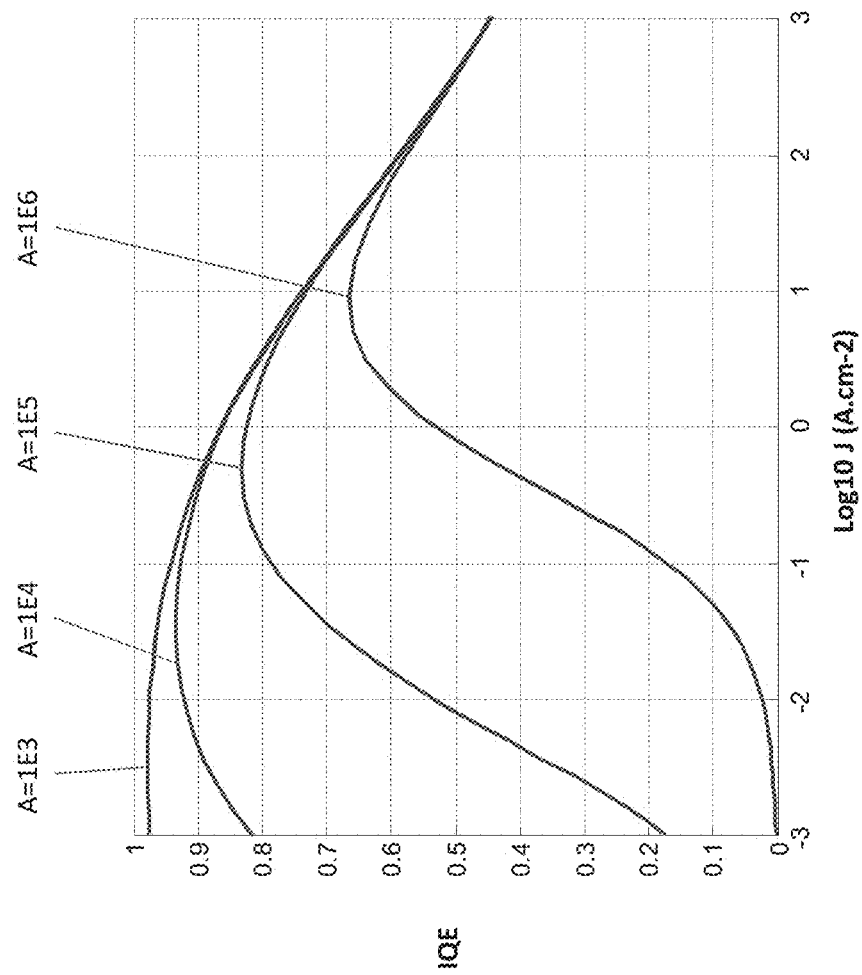
FIG. 3 shows a modified ABC model in which screening effects are included in B and C.

The conventional coefficients A, B, and C can be derived from the following experimental quantities: a=G_NR/n, b=G_Rad/n^2, and c=(G_NR−An)/n^3. (For clarity, these expressions are evaluated as follows: A is first determined from expression a, then its value is subtracted in expression c). FIGS. 5-B-D respectively show the quantities (a, b, c) for this sample. A is given by the plateau of a at low carrier density. B and C are given by the value of b and c at all carrier densities—however, the ABC model expects that these values are constant, whereas the experiment shows that they depend on carrier density. This dependence can be explained by carrier screening (namely, at high carrier density, the polarization field in the QW is screened, which increases wavefunction overlap and thus increase B and C). Taking this dependence into account, we can define current-dependent coefficients B(n) and C(n). This refinement improves the accuracy of the ABC model and leads to the result shown on FIG. 3.

Despite this current-dependence, it can be convenient to still use a single-value for B and C in discussions. In the following, when numerical values of B and C are discussed, they correspond to the average values of b and c in the range n~1E18-5E18 cm-3 (i.e. before screening effects become significant).

Figure 5B:
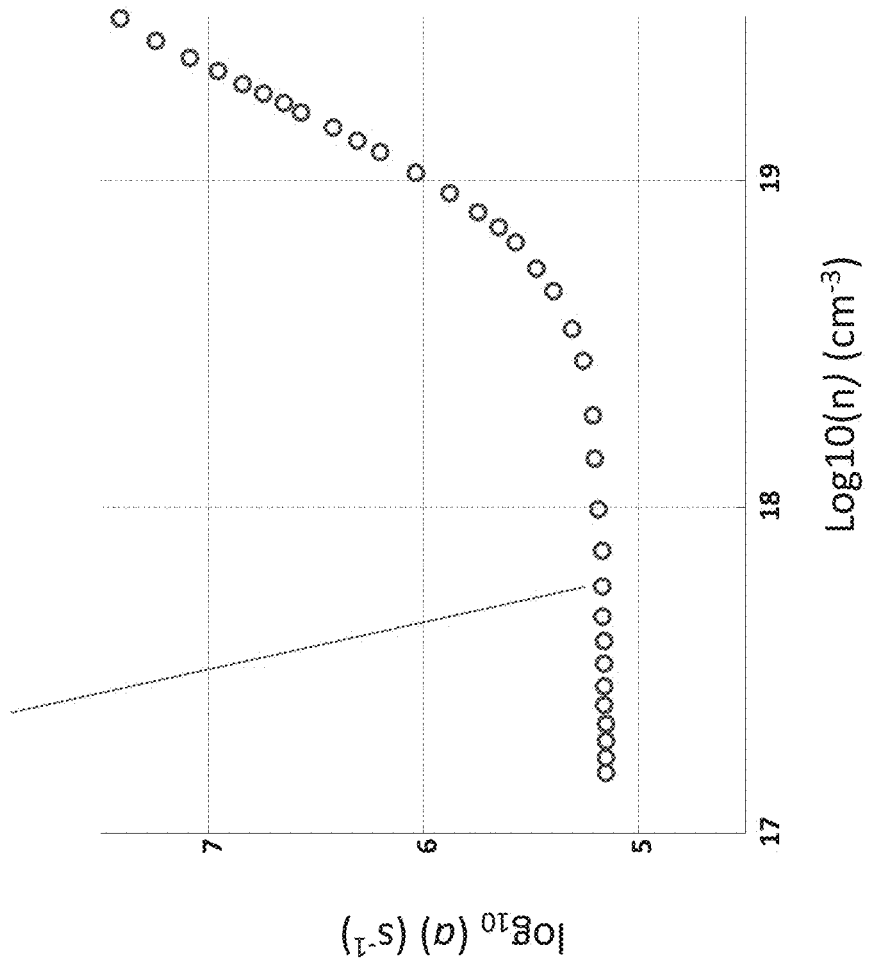
FIGS. 5B-5D show recombination quantities (a, b, c) as a function of carrier density (n).
Figure 5C:
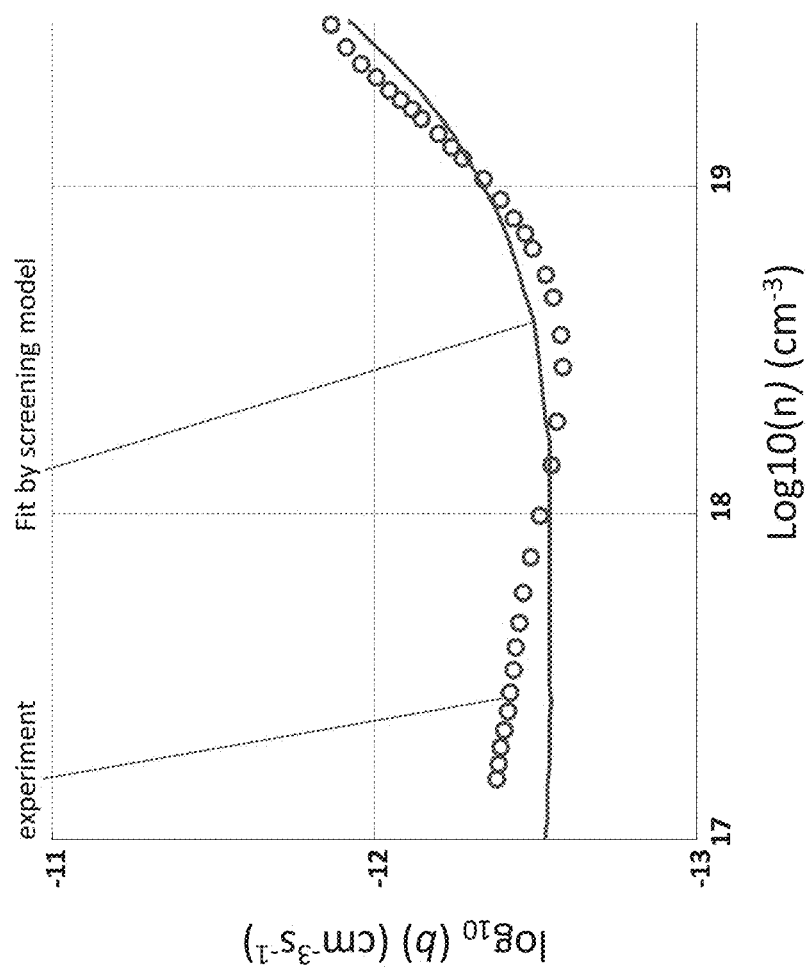
Figure 5D:
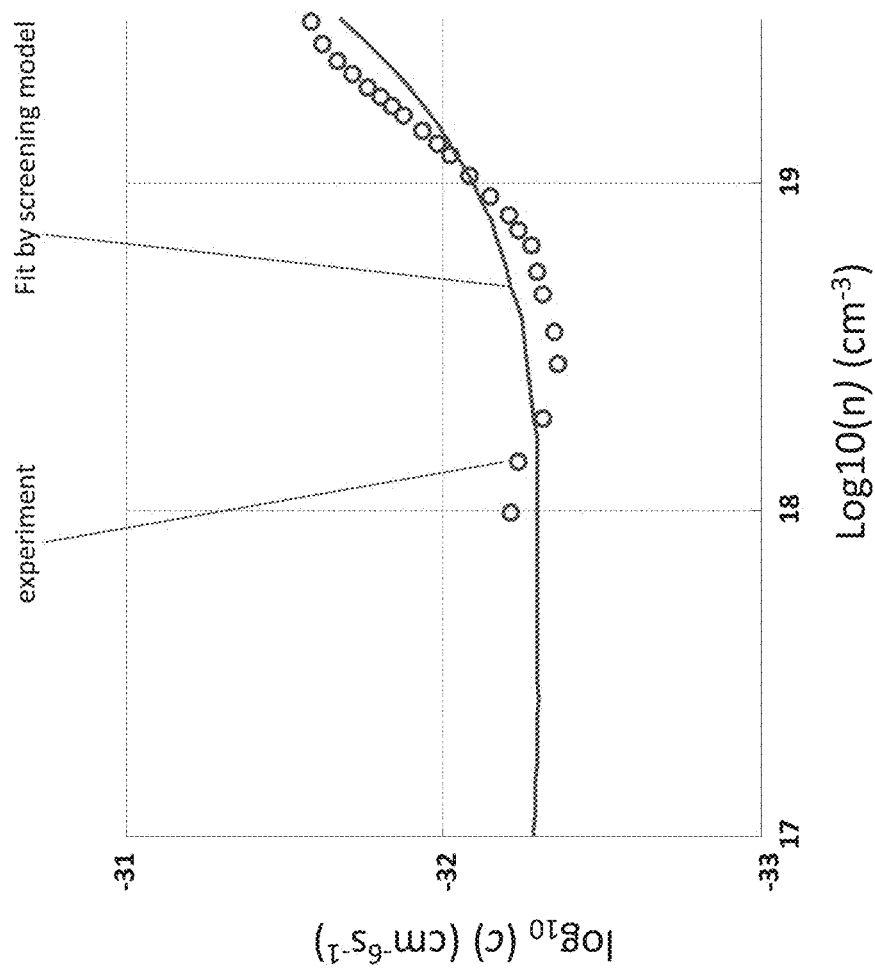
Figure 5E:
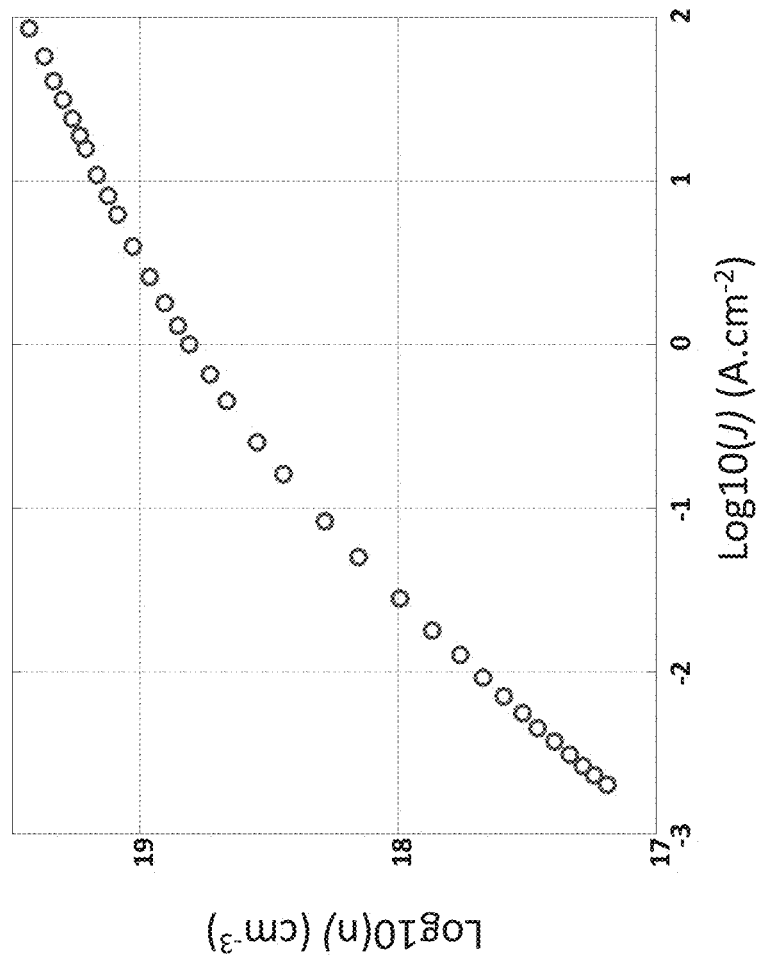
FIG. 5E shows the relationship between the carrier density n and the current density J.

Note that in FIG. 5A, the x-axis is the current density (J) whereas in FIGS. 5B-D the x-axis is the carrier density (n). The two quantities are related, and n is quantified thanks to the ODL measurement. For the sake of completeness, FIG. 5D shows the relationship between J and n.

Example 2—Coupling Betw15n Defects and Droop

Applicants grew a series of single-QW structures having the same design as described in the sample above (except for the QW composition which is 13% In in this series). The concentration of defects was varied across the series. This was achieved by several means. In a first run, Applicants inserted an InGaN superlattice before the pin region, and varied the thickness (i.e. the number of periods) of the SL. In a second run, Applicants varied the environment of the reactor used for growing the samples (labeled as conditions I and II). In a third run, Applicants varied the temperature of layer 4 (the undoped GaN layer under the QW). The samples are described in Table 2.

TABLE 2

| Sample # | SL thickness | Reactor condition | Layer temperature |
|---|---|---|---|
| 1 | 100% | I | +0 C. |
| 2 | 100% | II | +0 C. |
| 3 | 80% | II | +0 C. |
| 4 | 50% | II | +0 C. |
| 5 | 22% | II | +0 C. |
| 6 | 0% | II | +0 C. |
| 7 | 100% | II | +150 C. |

These epitaxial variations resulted in a large variation in point defect concentration, which will be detailed below. Comparing samples 1 and 2, reactor condition II led to higher point defect concentration. Comparing samples 1-6, thinner SL led to higher point defect concentration. Comparing samples 1 and 7, higher layer temperature led to higher point defect concentration. Defect concentration was assessed by performing ODL measurements on each sample.

The results from the ODL experiment are shown on FIG. 6A-G.

Figure 6A:
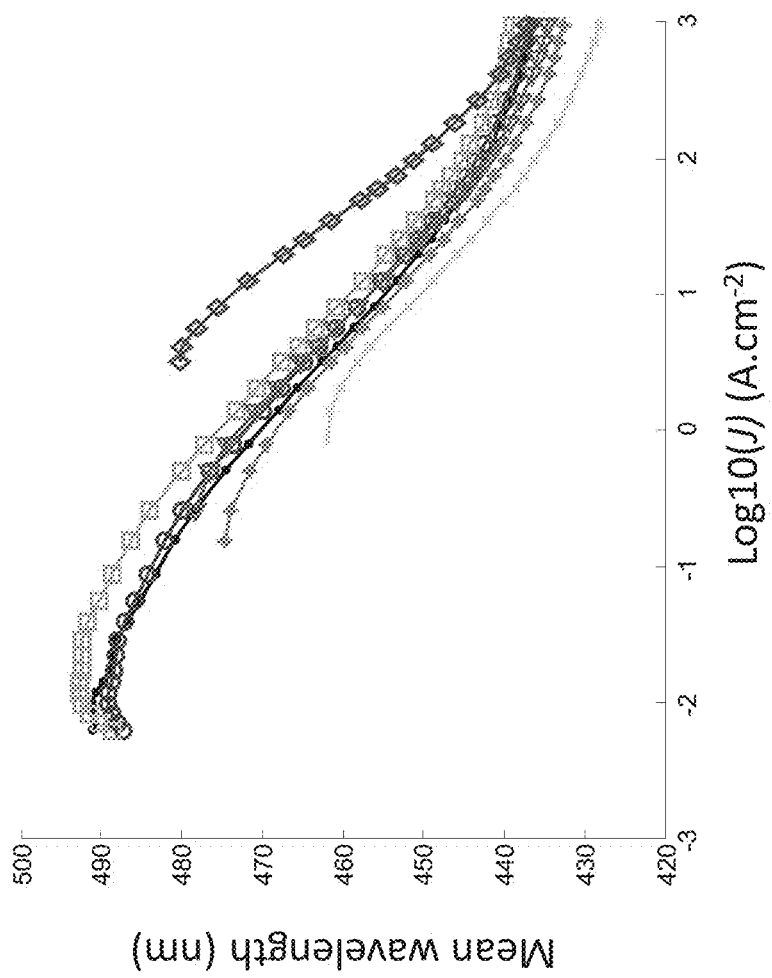
FIG. 6A shows the mean wavelength of various samples, and confirms that all samples have the same QW design and In content.

FIG. 6A shows the mean wavelength of each sample. It shows that the samples all have the same wavelength (which varies with current density, due to the screening effect discussed previously). This confirms that all samples have the same QW design and In content.

Figure 1:
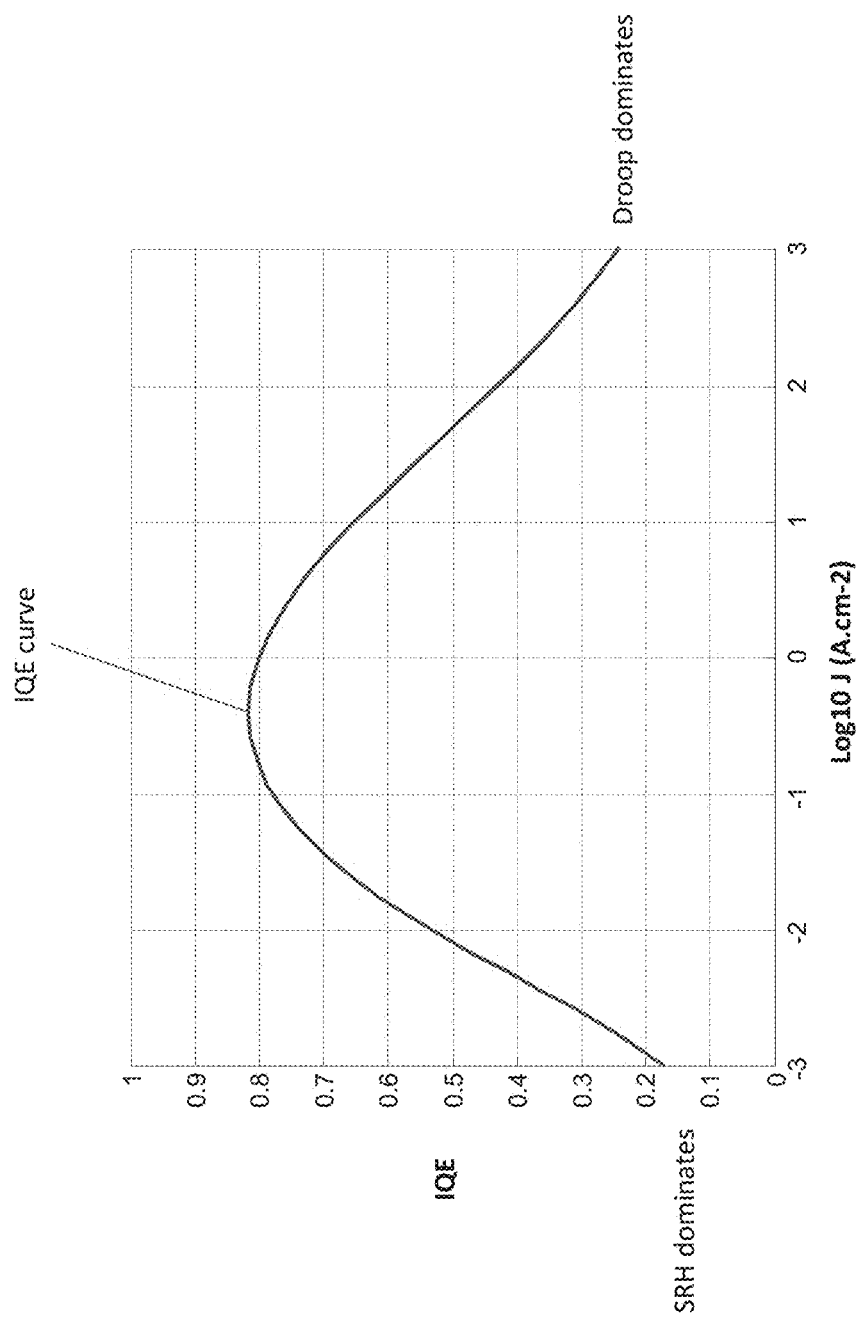
FIG. 1 shows a conventional "ABC" modeling of a bell-shaped efficiency curve of a semiconductor.
Figure 2A:
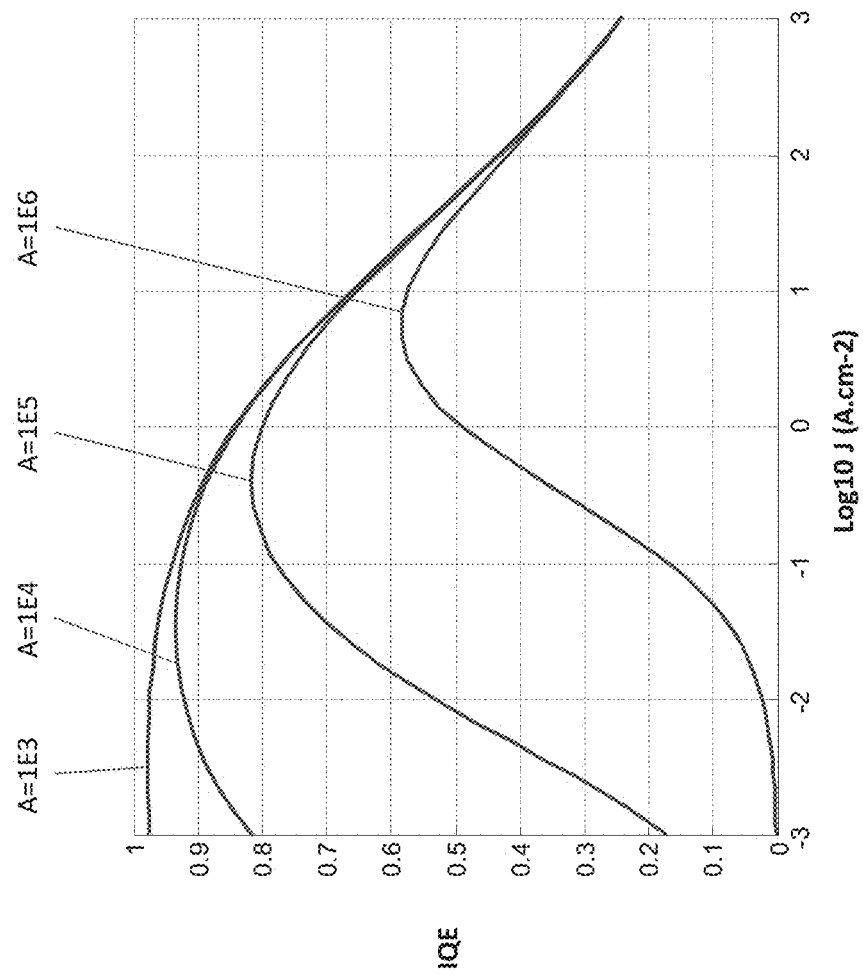
FIG. 2A shows modeled IQE using a basic ABC model for various values of A.
Figure 2B:
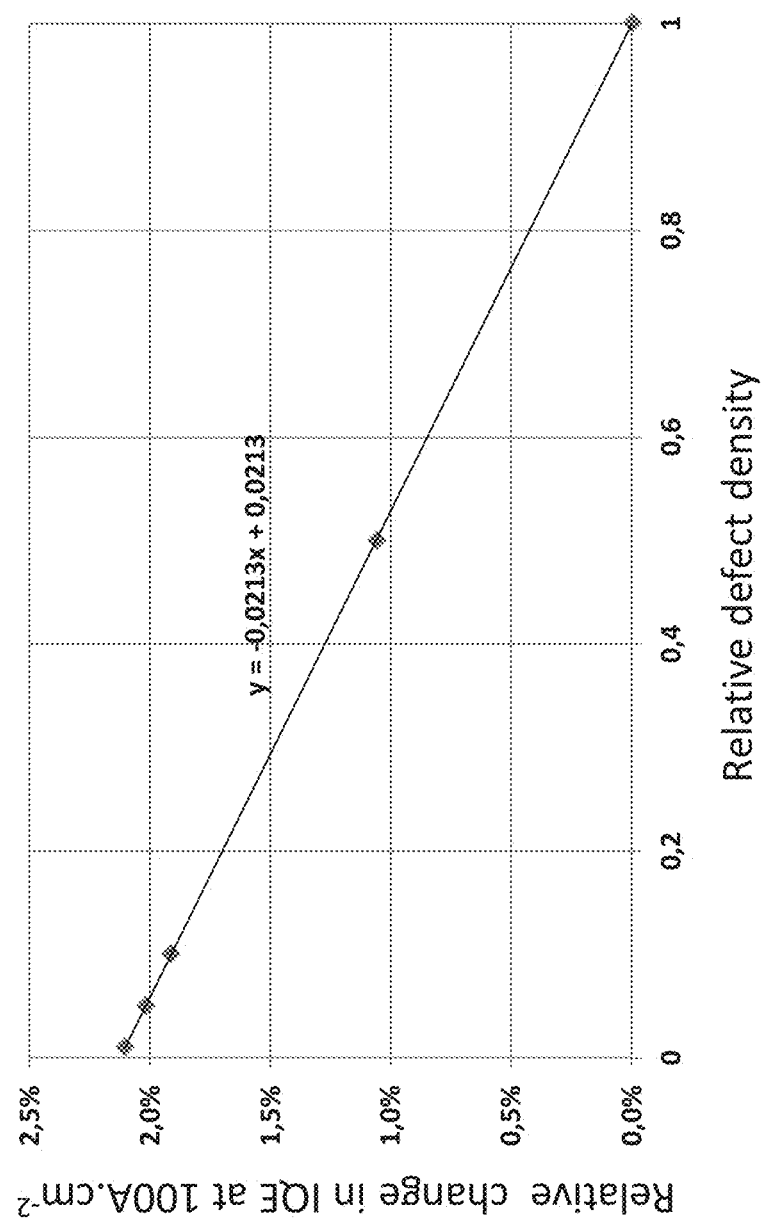
FIG. 2B shows the very the relative variation of IQE as a function of the relative defect density.
Figure 6B:
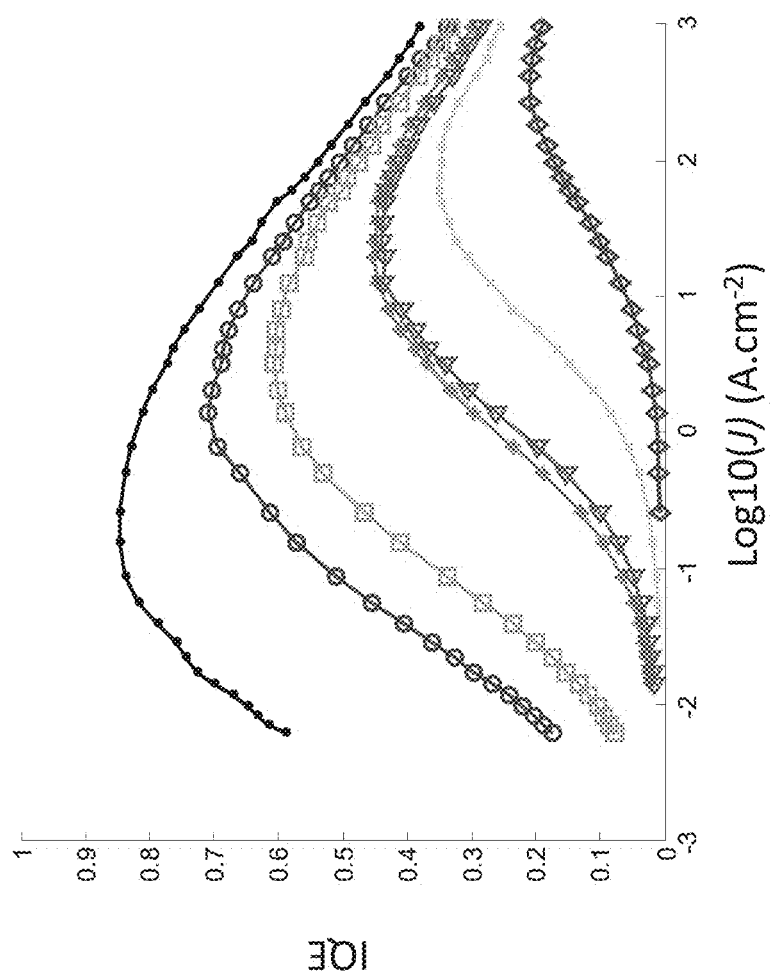
FIG. 6B shows the IQE of the samples, and shows that the epi variations have a strong impact on the samples' IQE.

FIG. 6B shows the IQE of the samples, and shows that the epi variations have a strong impact on the samples' IQE. Noteworthy, these variations are observed not only at low current density (as would be expected from a variation in defect density), but also at high current density. At J=100 A·cm-2, the various IQE curves do not converge to a near-equal value, as was predicted from FIGS. 2-3. Rather, the samples with relatively low IQE at low current density are also significantly penalized at high current density.

Figure 6C:
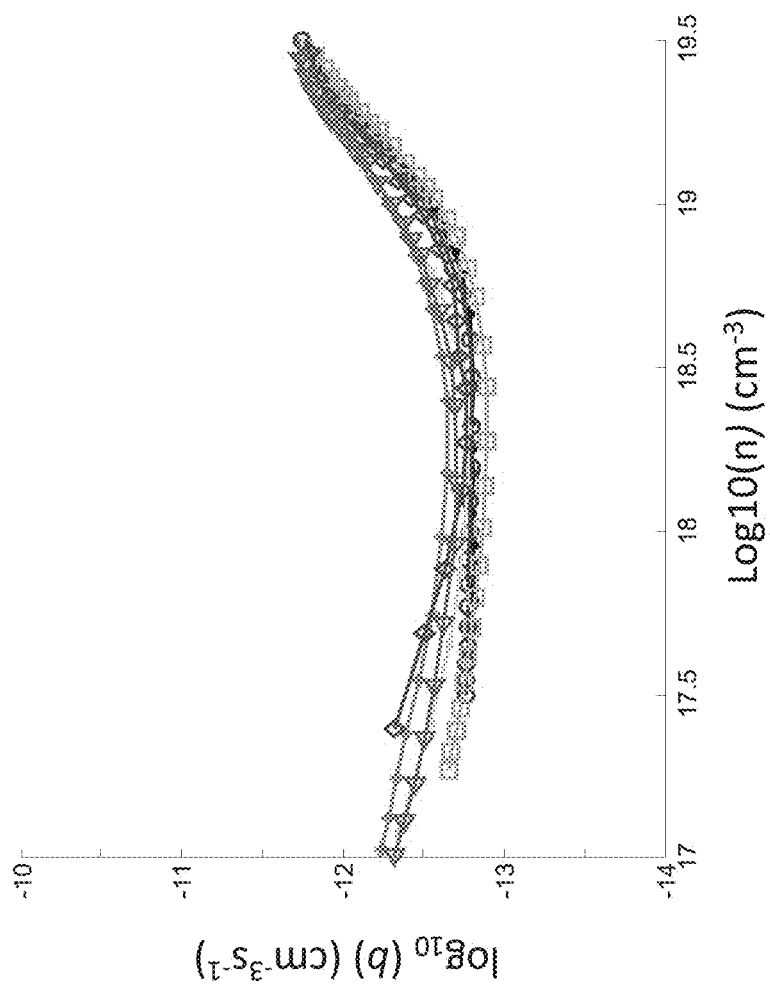
FIG. 6C shows the quantity b, from which the B coefficient is evaluated.

FIG. 6C shows the quantity b, from which the B coefficient is evaluated. This figure indicates that the B (i.e. radiative) coefficient is unaffected by the epitaxial variations, and is nearly identical for all samples. This is expected. The B coefficient is set by the design of the active region, and does not depend on variations in defect density. Thus, the variation in IQE is not related to a change in radiative rate.

Figure 6D:
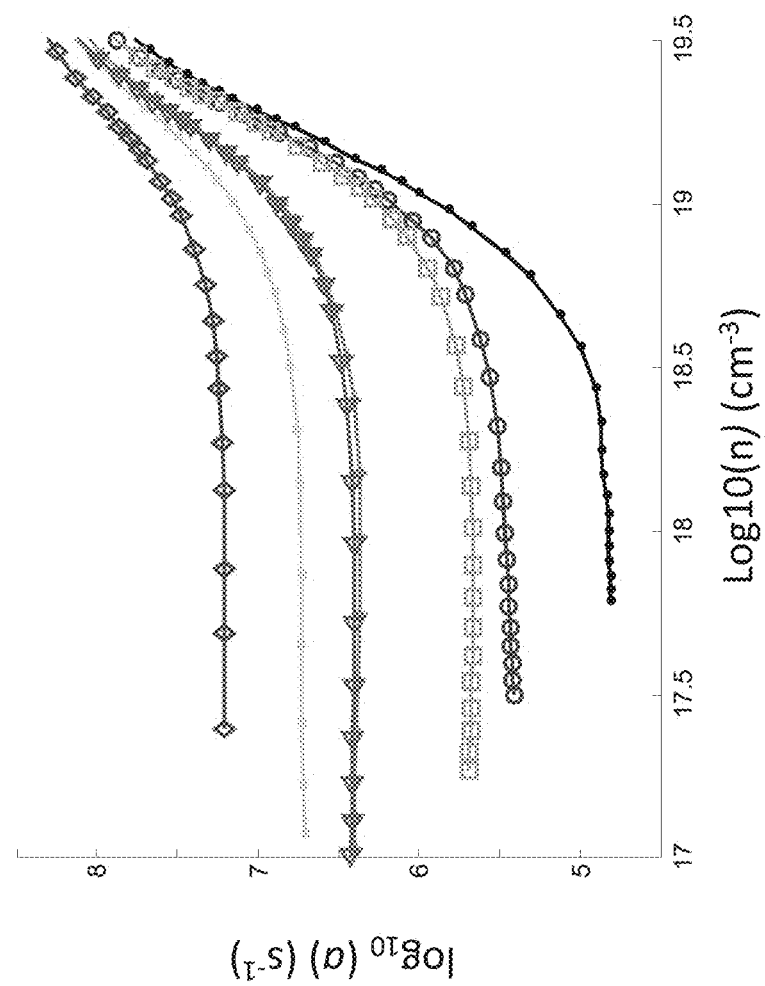
FIG. 6D shows the quantity a, from which the A coefficient is derived.

FIG. 6D shows the quantity a, from which the A coefficient is derived. It shows a pronounced variation of A, in line with the large variations of IQE shown on FIG. 6B. The samples with higher A have the lowest IQE at all currents, as expected. Table 3 summarizes the values of A and corresponding IQE. For relative comparisons in this table, sample #2 is taken as the baseline (an arbitrary choice). The relative defect density is equal to the relative change in A.

TABLE 3

| Sample # | log10(A) (s−1) | Defect density (relative) | IQE (absolute) at 100 A · cm−2 | Relative IQE gain at 100 A · cm−2 |
|---|---|---|---|---|
| 1 | 4.85 | 0.2 | 56% | +12% |
| 2 | 5.5 | 1.0 | 50% | — |
| 3 | 5.65 | 1.4 | 47% | −7% |

TABLE 3-continued

| Sample # | log10(A) (s−1) | Defect density (relative) | IQE (absolute) at 100 A·cm-2 | Relative IQE gain at 100 A·cm-2 |
|---|---|---|---|---|
| 4 | 6.4 | 7.9 | 40% | −20% |
| 5 | 6.72 | 16.6 | 34% | −32% |
| 6 | 7.2 | 50.1 | 18% | −65% |
| 7 | 6.4 | 7.9 | 40% | −20% |

Figure 6E:
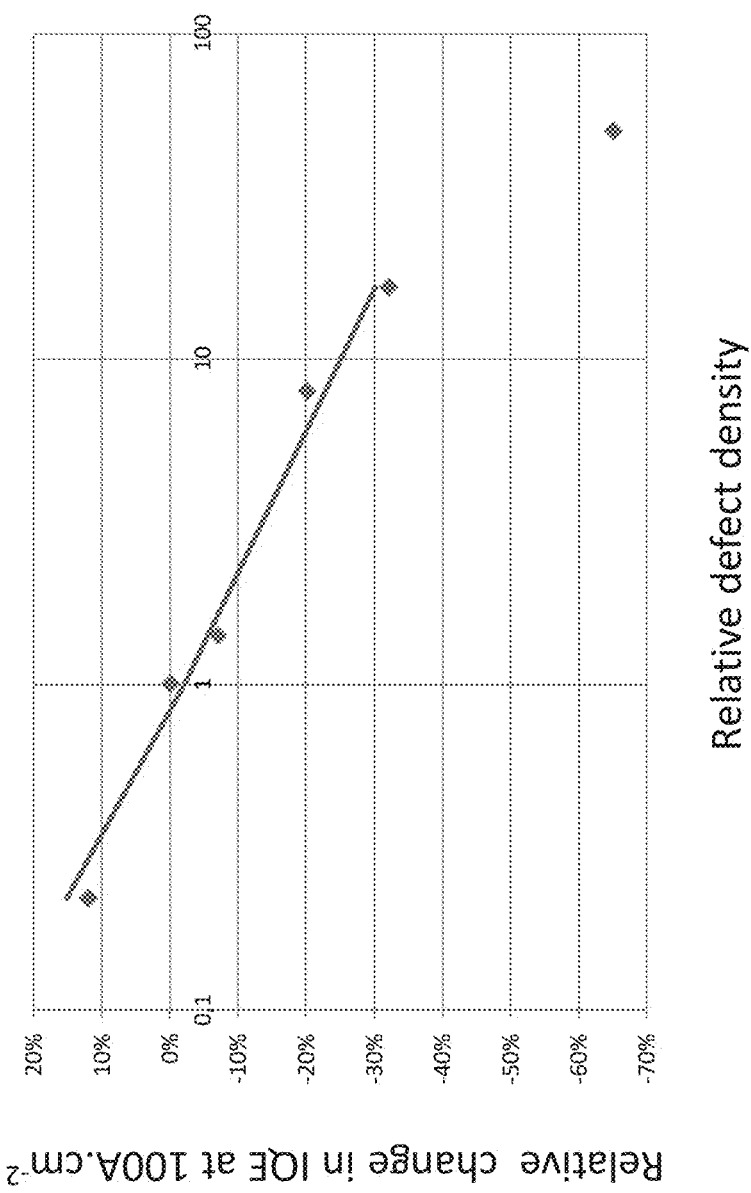
FIG. 6E shows the correlation between defect density and IQE at 100 A·cm-2.

The correlation between defect density and IQE at 100 A·cm-2 is shown on FIG. 6E.

The impact of defects on A and on low-current IQE is not surprising. However, the correlation seen between A and IQE at 100 A·cm-2 is surprising and contrary to expectations based on the conventional theory outlined above. Indeed, at such high current density, SRH recombinations cause a very low contribution to the total recombination rate.

Figure 6F:
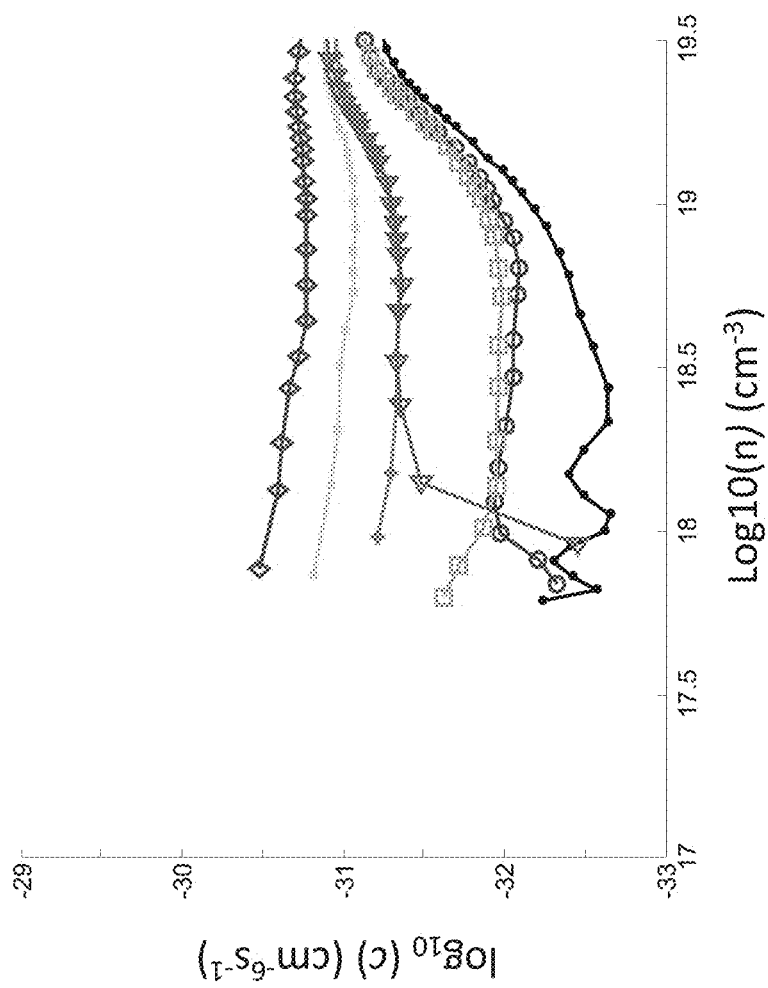
FIG. 6F shows the quantity c, from which the C coefficient is derived.

FIG. 6F shows the quantity c, from which the C coefficient is derived. Here again, a surprising result is observed. Based on prior art knowledge, one would expect C to be substantially equal for all samples—just like B was—because C is expected to depend on the structure design (like B). Instead, C is observed to vary strongly and become larger for samples having worse IQE.

Thus, there appears a correlation between the concentration of point defects (measured by A) and the magnitude of the droop current (measured by C).

Figure 6G:
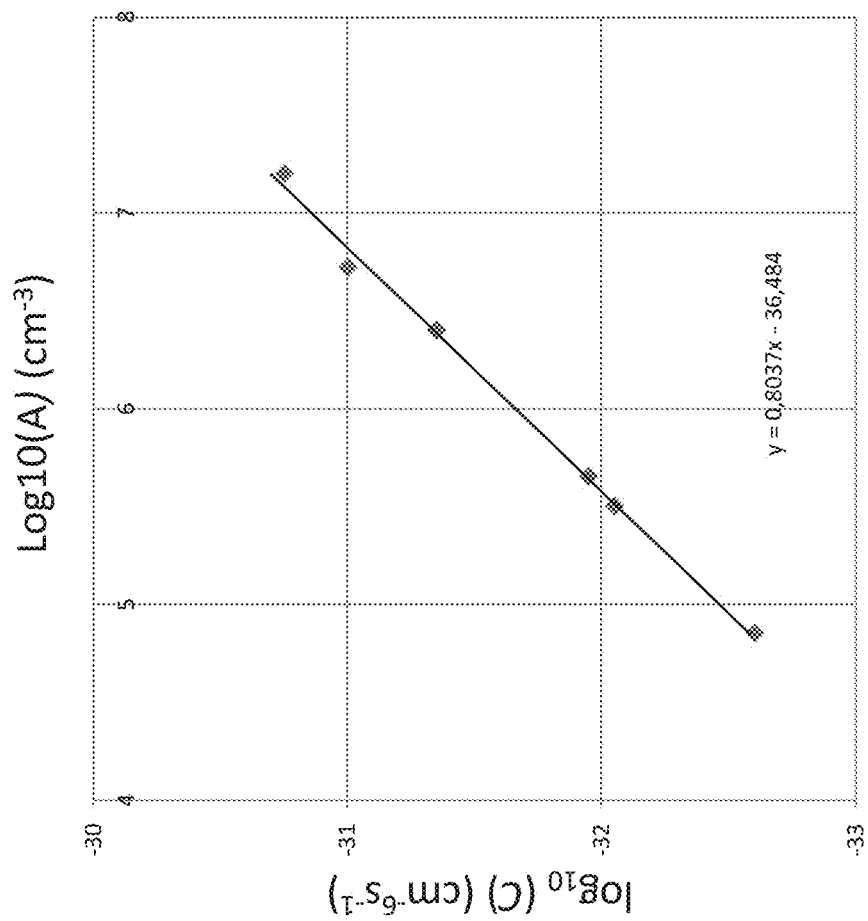
FIG. 6G shows the correlation between the experimental values of A and C, shown on a log-log plot.

FIG. 6G shows the correlation between the experimental values of A and C, shown on a log-log plot. (As a reminder, for C, we use the value of (c) in the range n=1E18-5E18 cm-3, before the onset of screening). An excellent linear relation is observed between A and C, over two orders of magnitude of variation. The slope of this linear relationship is about 0.8, which is close (within experimental error) to a slope of 1. Therefore, to first order, C varies linearly with A.

This constitutes an important unexpected result of this disclosure. Applicants' experiments show that at least part of the droop current is related to the presence of defects in the crystal. Therefore, one can reduce droop by reducing the defect density. This is exemplified for instance by comparing growth conditions I and II (samples #1 and #2): condition I is better, leading to lower defects, which leads to a significant increase in IQE at high current density.

More precisely, the behavior of c in FIG. 5F-G is understood as follows. Applicants propose that c is governed by an equation of the form c=C+D, where C is an intrinsic droop coefficient (which does not depend on defect density) and D is an extrinsic droop coefficient which scales with defect density. We observe that C undergoes a screening effect (as was already shown in FIG. 4D), while D does not. The droop recombination rate is $G\_droop=(C+D)*n^3$. D approximately scales linearly with A. By reducing the defect density, D can be reduced to a very small value, and the droop rate reaches its lower bound $Cn^3$, caused by the intrinsic process only.

In the case of the present structure, Applicants found the following values: $B=1.6E-13$ s$^{-1}$ cm$^{-3}$, $C=2.5E-33$ s$^{-1}$ cm$^{-6}$, and $D=k*A$ with $k=1.6E-38$ cm$^{-6}$.

In other samples, the relative values of B, C and D may all be reduced (for instance, by a variation in electron-hole overlap due to a change in In content or QW thickness). However, B, C and D are roughly affected by the same factor when such overlap variations occur. Therefore, the ratio $(C+D)/B$ is generally indicative of the quality of an LED, regardless of the specific value of B. Ideally, D is nearly zero and the ratio approaches the intrinsic ratio $C/B=1.6e-20$ cm$^3$.

In contrast, an LED with large amounts of defect density may have a ratio of about $(C+D)/B\sim 7E-20$ cm$^3$. The ratio $(C+D)/B$ is a parameter which describes the behavior of IQE at high current density, where $IQE=Bn^2/(Bn^2+(C+D)n^3)=1/(1+n*(C+D)/B)$.

Accordingly, embodiments are characterized by an efficiency curve having the following dependence on n at high current: $IQE=1/(1+n*k)$, where k is lower than 5E-20 cm$^3$ (or 3e-20 cm$^3$, 2e-20 cm$^3$, 1e-20 cm$^3$).

This behavior can also be expressed as a function of the current density J, since at high current $J\sim e*t*(C+D)n^3$ (with e the electron charge and t the active region thickness); hence $IQE=1/(Q/e/t)^{1/3}$ $(C+D)^{2/3}/B)$. Accordingly, embodiments are characterized by an efficiency curve having the following dependence on J at high current: $IQE=1/(1+k*(J/e/t)^{1/3})$, where $k=(C+D)^{2/3}/B$ is lower than 2E-9 s$^{1/3}$ cm$^{-1}$ (or 1.5E-9, 1E-9). Here the active region thickness t is expressed in cm and the electron charge is e=1.6E-19. In some embodiments, an LED is improved by reducing the defect density such that the value of k is decreased by at least 0.5E-9 s$^{1/3}$ cm$^{-1}$.

In some embodiments, the improvement in the LED is assessed by measuring the relative increase in IQE at low current density and at high current density. According to prior art understanding, the increase at high current density should be small, even if the improvement at low current density is large, because SRH recombinations have little influence at high current density.

Figure 7A:
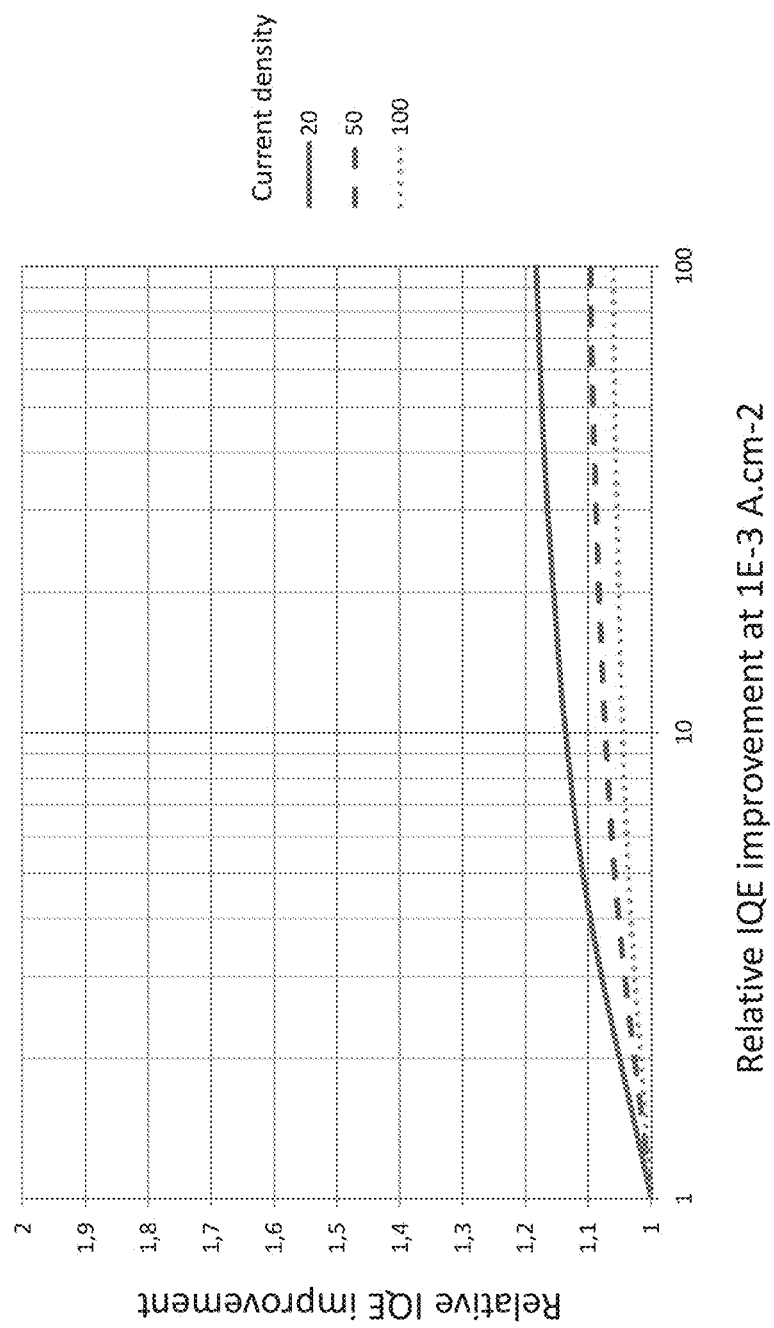
FIG. 7A shows the correlation between low- and high-current density IQE increases, according to the ABC model, for an LED with an initial peak IQE of 50%.

FIG. 7A shows the correlation between low- and high-current density IQE increases, according to the ABC model, for an LED with an initial peak IQE of 50%. The x-axis is the relative increase in IQE at 1E-3 A·cm-2. In this low-current region, the IQE increase is inversely proportional to the defect density. According to this figure, the IQE increase at high current density is moderate: at 50 A·cm-2 and 100 A·cm-2, IQE is increased by less than 10% even when the low-current IQE is increased by 100 times. If the low-current IQE is only increased by 2×, the high-current IQE is only increased by a few percent (less than 3%).

Figure 7B:
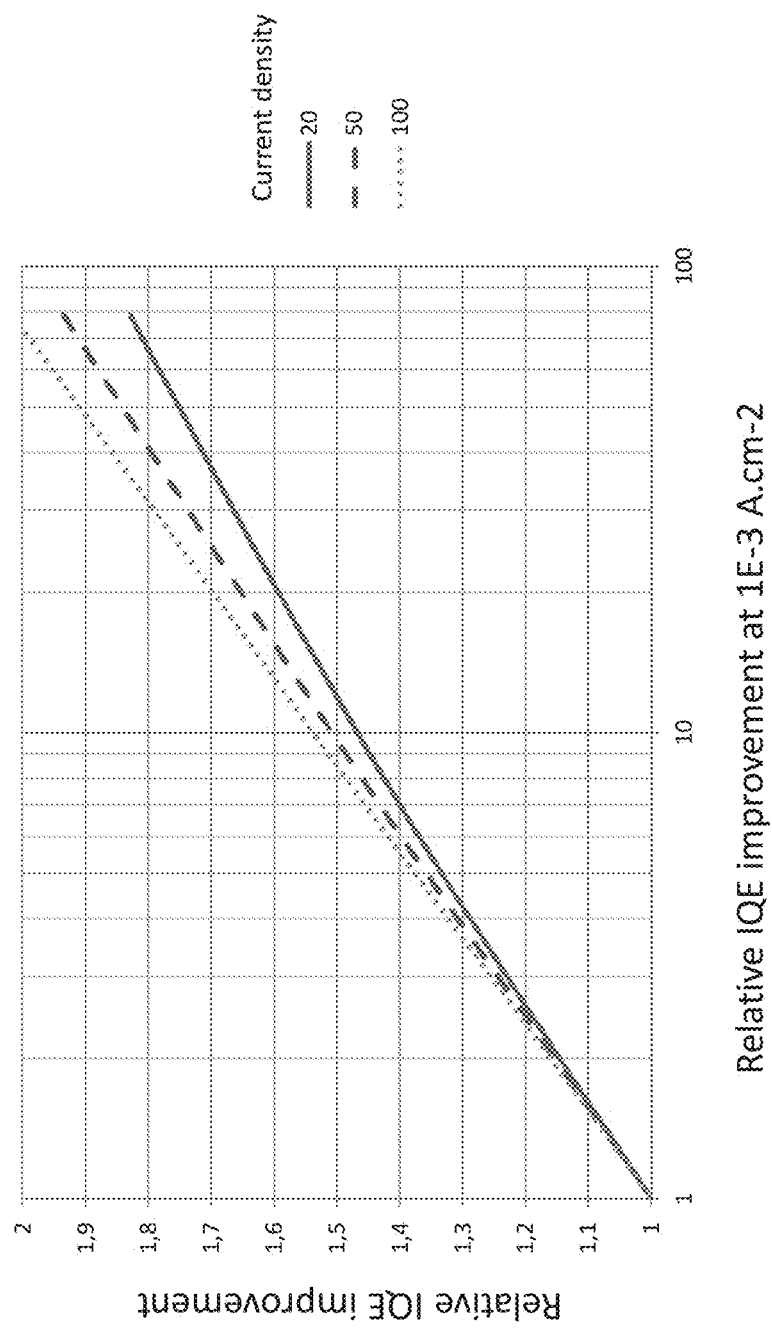
FIG. 7B is similar to FIG. 7A but shows predictions according to the present invention.

FIG. 7B is similar to FIG. 7A but shows predictions according to the present invention. In contrast to FIG. 7A, the IQE increase at high current is very high. Whether considering a current of 20 A·cm-2, 50 A·cm-2 or 100 A·cm-2, the IQE increases by about 15% with a 2× improvement in low-current IQE, and by about 50% with a 10× improvement in low-current IQE.

Figure 7C:
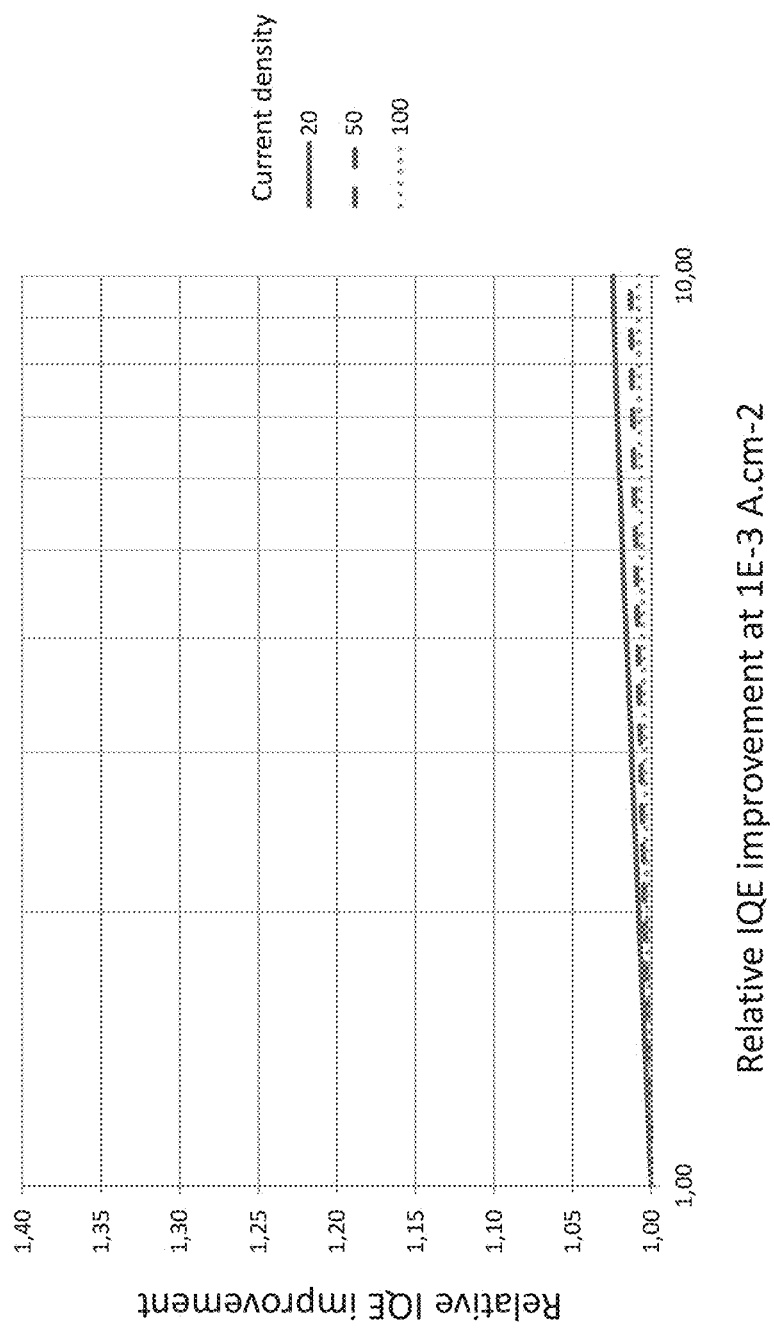
FIG. 7C-7D are the same as FIG. 7A-B, but for an LED having an initial peak IQE of 70%.
Figure 7D:
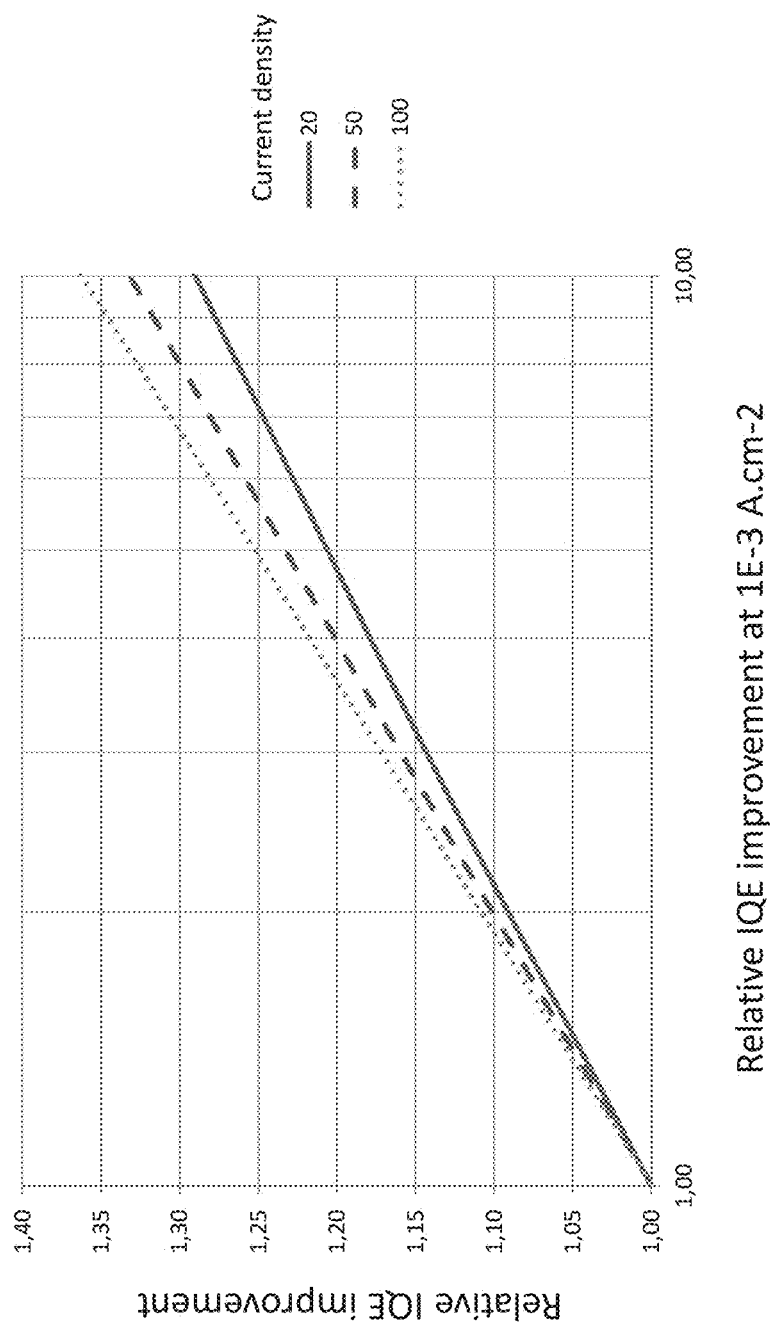

FIG. 7C-D are the same as FIG. 7A-B, but for an LED having an initial peak IQE of 70%. Here again, the ABC model predicts very small high-current gains. The present invention predicts that a 2× increase in low-current IQE can lead to a 10% increase in high-current IQE (whether the high current is considered as being 20 A·cm-2, 50 A·cm-2 or 100 A·cm-2), and a 10× increase in low-current IQE can lead to an about 30% increase in high-current IQE.

FIGS. 11 (A)-(B) provide further experimental evidence of the coupling between point defects and droop, but for QWs with a higher In composition. Three samples are show: all have an InGaN single quantum well with a thickness of 2.5 nm and a nominal In composition of 25%. From sample 1 to sample 3, defect reduction is achieved, through a combination of optimized growth parameters and underlayer design as disclosed herein. The corresponding IQE (measured by photoluminescence) is shown as full lines in FIGS. 11 (A)-(B). IQE increases in accordance with defect reduction, both at low current (as expected) and at high current (as per the present teachings). In FIG. 11 (A), the data is fitted by a conventional ABC model (dashed lines) whose ABC coefficients are optimized for sample 3, and letting A increase from sample 3 to sample 1: the IQE shape is never well predicted, because the coupling between defects and droop is ignored. In contrast, in FIG. 11 (B), the ABC model is modified to include the coupling between A and c as taught herein, leading to much-improved fits. This confirms that the findings taught herein are not limited to a specific QW material composition, and are instead valid for a broad range of compositions.

Example 3—Wavelength Dependence

In a third experiment, Applicants investigated the effect of the QW's indium content (which controls its emission wavelength) on recombinations. Applicants grew a series of structures similar to that of FIG. 4, with various In contents in the range 10%-25%. For these various samples, Applicants measured the values of a, b and c leading to the values of A, B, and (C+D).

Figure 8A:
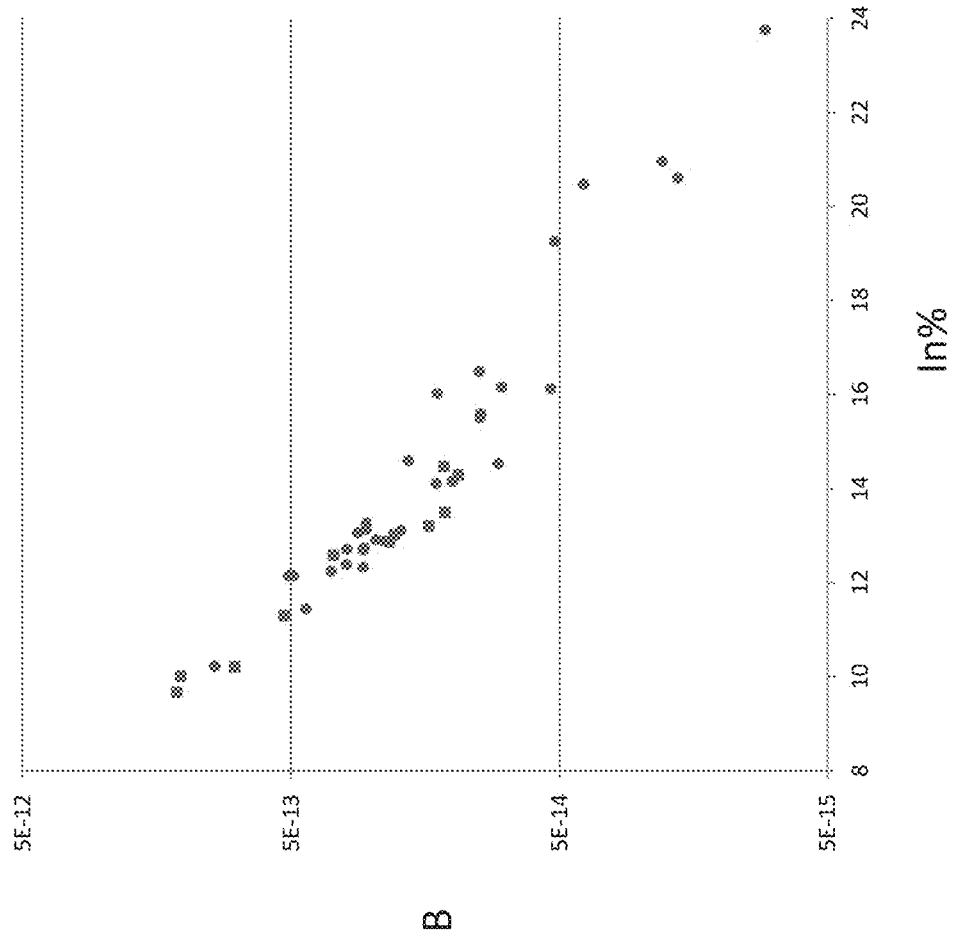
FIG. 8A shows the value of B for samples of Example 3.

FIG. 8A shows the value of B for all samples. The samples are grown under the epi conditions I or II, as described above. Condition I is shown as squares, and condition II as circles. This figure shows a reduction in B with In content, because active regions with more In have stronger polarization fields which separate the electron and hole wavefunctions, thus reducing B. This is expected.

Figure 8B:
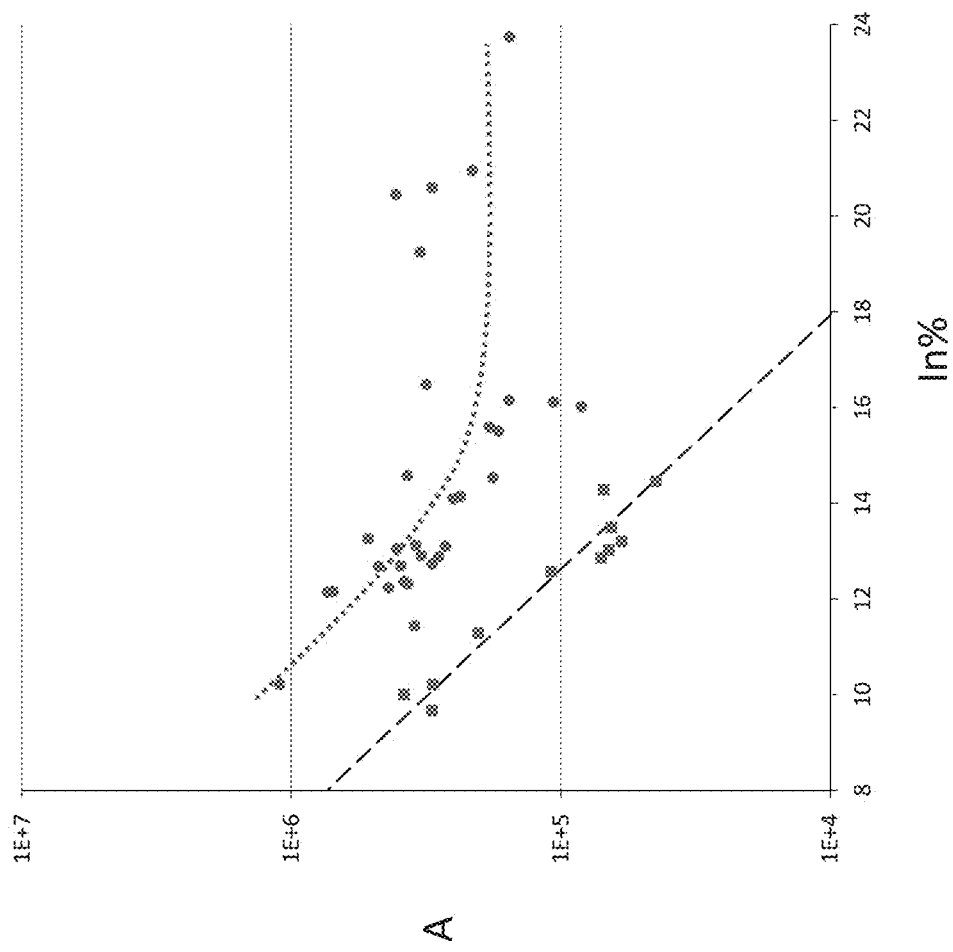
FIG. 8B shows the corresponding values of A for the samples.

FIG. 8B shows the corresponding values of A. First, we describe samples grown under condition I. The value of A decreases for higher In content, just like the value of B did. This is because the overlap decrease also impacts the value of A, as explained in DAVID ET AL., *Field-assisted Shockley-Read-Hall recombinations in III-nitride quantum wells*, Appl. Phys. Lett. 111, 233501 (2017) (David17b). This trend is indicated by the dashed line. This trend is expected. We now consider the samples grown under condition II. For a given [In], the value of A is higher than under condition I because this epi condition is not as good—as previously described. Further, this data series was extended to larger values of [In] beyond 16%. In this case, instead of observing a decrease of A with [In] as expected, we observe that A instead roughly saturates (as indicated by the dotted line). This indicates that the concentration of point defects is increasing for such values of [In], and that this increase in point defects overrides the natural decrease of A with [In]. In other words, the wavefunction overlap decreases, which should decrease the value of A; however, a concurrent increase in defect density masks this trend. This indicates that LEDs with high In content are more naturally prone to integrate defects.

Figure 8C:
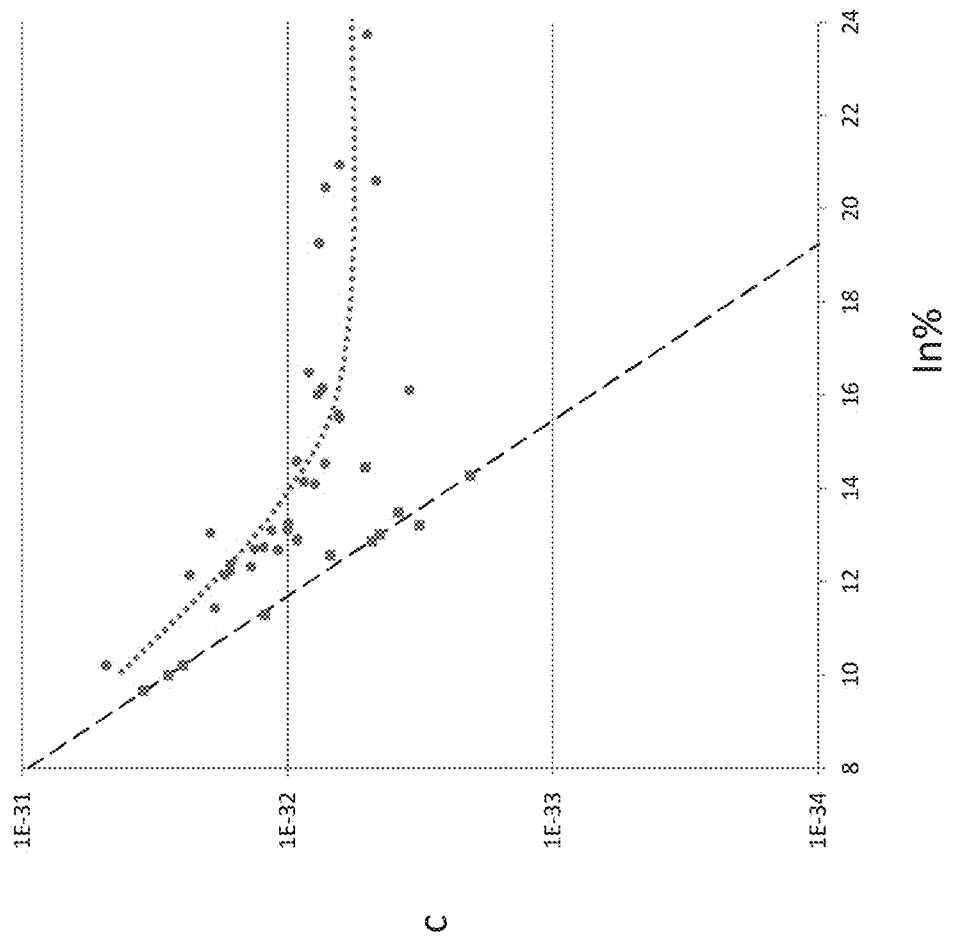
FIG. 8C shows the corresponding values of c=(C+D) for the samples.

FIG. 8C shows the corresponding values of c=(C+D). These closely mirror the behavior of A. Namely, epi condition I leads to lower values of C than condition II, and for condition II c decreases with In because of a decrease in wavefunction overlap. For epi condition II, a plateau in c is observed for [In]>16%. Based on the previous observations, the plateau of c is understood as being caused by the plateau of A. In other words, the increasing amount of point defects lead to an increase in the extrinsic droop current, which overtakes the natural decrease with [In].

These measurements give an explanation to the well-known green gap problem, which is a major technology challenge for III-Nitride LEDs. The green gap describes the fact that the IQE of LEDs is strongly reduced when their wavelength enters the cyan-green regime (corresponding to [In] above 15%). The green gap is not well understood, and is manifested as a lower IQE at both low and high current density. The high-current IQE deficit is the most important for applications.

Applicants' observations show that the green gap is caused by the following related effects: 1) when [In] increases, the epi tends to integrate more defects which increases A and 2) this in turn also increases the extrinsic droop process and the value of c.

Consequently, this invention indicates a method to solve the green gap by reducing the defect density of an LED having a large In fraction. Indeed, this leads to a reduced droop and to high IQE at high-current. While it is generally understood that reducing defects may be desirable for long-wavelength LEDs, the prior art does not appreciate to which extent this can be impactful for high-current performance.

Some embodiments are long-wavelength LEDs with low defect density and high efficiency at high current. Some embodiments are long-wavelength LEDs with slow SRH lifetimes and high efficiency at high current. Embodiments have an emission wavelength of at least 500 nm (or 520 nm, 550 nm, 600 nm) and an SRH lifetime slower than 10 us (or 50 us, 100 us, 500 us, 1 ms) and a peak IQE higher than 50% (or 60%, 70%, 80%) and a high-current efficiency at a current of 10 A·cm-2 higher than 35% (or 40%, 45%, 50%, 60%).

| A (s−1) | SRH lifetime (s) | peak IQE | High current IQE |
|---|---|---|---|
| 2E5 | 5 us | 42% | 25% |
| 1E5 | 10 us | 57% | 33% |
| 5E4 | 20 us | 70% | 41% |
| 2E4 | 50 us | 82% | 50% |
| 1E4 | 100 us | 88% | 55% |

In a specific example, a prior art LED has [In]=20%, and values of A=4E5 s-1, B=4E-14 s-1·cm-3, c=7E-33 s-1·cm-6. This LED has a peak IQE below 30%. Embodiments improve on this LED by reducing the value of A, leading to an increase in peak IQE and IQE at 10 A·cm-2 as follows:

These embodiments contrast with the prior art, where long-wavelength LEDs have short SRH lifetimes shorter than 1 us (and often shorter than 100 ns).

Some embodiments employ different crystal planes from the conventional c-plane to further improve high-current efficiency (by increasing wavefunction overlap), and use the present teachings to reduce defect density. Some embodiments employ thick active regions (rather than the 4 nm single QW described so far) to further improve high-current efficiency (by increasing wavefunction overlap), and use the present teachings to reduce defect density. Accordingly, the high-current performance described in the table above can be pushed from 10 A·cm-2 to 20 A·cm-2 or 50 A·cm-2 or 100 A·cm-2. Thus, in general, the present teachings can be combined with other methods known in the art to improve performance. In some cases, a defect reduction is achieved (leading to lower droop) and the active region configuration is further changed to best benefit from the defect reduction.

Similar embodiments have active regions with higher [In] (for instance, in the range 20-22% or 20-25% or 20-30% or 25-30% or 30-40% or 40-50% or 50-60%), but also benefit from slow SRH times and high peak IQEs.

In general, the values of A, B and C vary with [In] due to the change in polarization fields. For instance, for a same defect density and peak IQE, an LED with [In]=10% may have A=3E5 $s^{-1}$, B=8E-13 $s^{-1}$ $cm^{-3}$, c=3E-32 $s^{-1}$ $cm^{-6}$ whereas an LED with [In]=15% may have A=3E4 $s^{-1}$, B=8E-14 $s^{-1}$ $cm^{-3}$, c=3E-33 $s^{-1}$ $cm^{-6}$. These values correspond to some of the best LEDs shown on FIG. 8A-C (i.e. LEDs having low values of A, and values of c quite close to the intrinsic limit: c~C). Even though A, B and c vary by about tenfold, their ratios remain roughly constant. Therefore, the quality of an LED can be expressed by the ratios A/B and c/B, regardless of its In content—with lower values indicating a better LED. Both of the examples above have A/B-4E17 $cm^3$ and c/B-4E-20 $cm^{-3}$. In contrast, prior art LEDs may have A/B-1E19 $cm^3$ and c/B-1E-18 $cm^{-3}$ or even higher values.

Accordingly, some embodiments of the invention are characterized by having recombination coefficients A, B, c with A/B and c/B respectively less than 5E18 $cm^3$ and 5E-19 $cm^{-3}$ and a peak IQE above 40% (or less than 2E18 $cm^3$ and 2E-19 $cm^{-3}$ with peak IQE>50%, or less than 1E18 $cm^3$ and 1E-19 $cm^{-3}$ with peak IQE>70%, or less than 5E17 $cm^3$ and 5E-20 $cm^{-3}$ with peak IQE>80%). Some of the values mentioned here (e.g. IQE>40%) may appear unsurprising in the context of blue LEDs; however, they are surprising and unexpected in the context of long wavelength LEDs (in the far-green, yellow, orange and red range). Accordingly, some of these values apply to LEDs with active regions having [In]>25% (or >30%, 40%, 50%, 60%) or in the range 25-60%.

For the embodiments just described, it is worth restating for the sake of clarity than A B and c are parameters describing the efficiency of the LED. As previously discussed, they may be derived from lifetime measurements and/or from fitting of the efficiency shape. The values of B and c are taken at moderate current density before the onset of screening—for instance, they are the values around the peak efficiency. In one embodiment, the efficiency curve can be fitted locally around its maximum with an ABC equation of the type $IQE=Bn^2/(An+Bn^2+cn^3)$ wherein the rations A/B and c/B verify the ranges previously mentioned. Of course, this ABC fit must be valid over a sufficient range of data to be meaningful Accordingly, in some embodiments, the efficiency curve can be well fitted by this ABC model over+/- one decade of current density (i.e. if the peak IQE occurs at a current density Jpeak, the fit is good in the range Jpeak/10-Jpeak*10) or over+/-two decades of current density, or over +/-half a decade (i.e. in the range Jpeak/3.3-Jpeak*3.3). In some embodiments, a good fit is one where the value of the model curve does not depart from the experimental IQE by more than +/-3% absolute IQE points (or +/-5 points, +/-1 point) in the range of interest.

Figure 9:
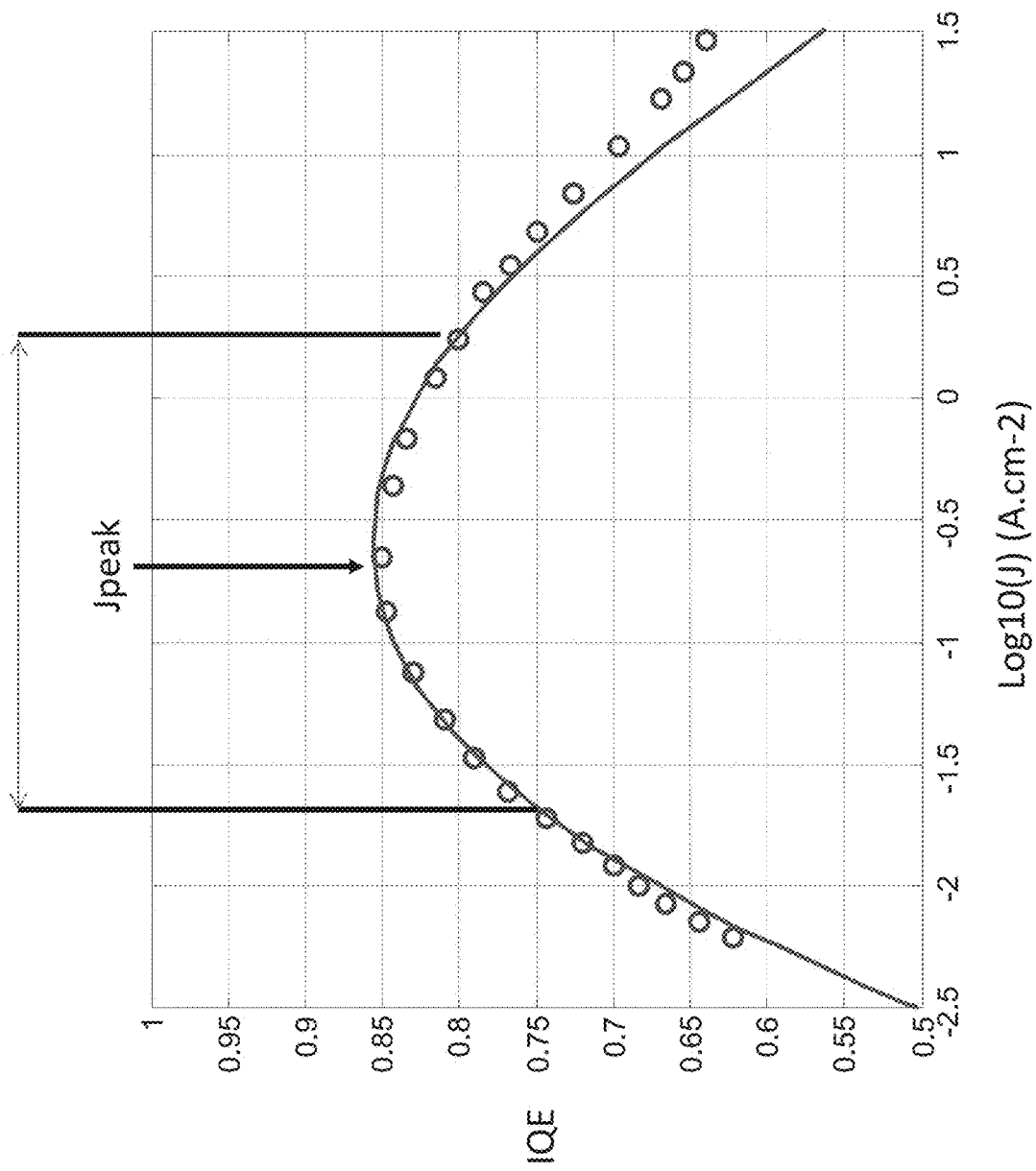
FIG. 9 shows the IQE for LED #1 of Table 3.

As an illustration, FIG. 9 shows the IQE for LED #1 of Table 3. The experimental IQE is shown as symbols (circles). The fitted IQE with a simple ABC model is shown as a line. Even though this model ignores screening effects at high current, it fits the IQE shape very well (better than +/-2% absolute IQE points) over two decades, from Jpeak/10 to Jpeak*10. The derived parameters are A=5.9E4 $s^{-1}$, B=1.4E-13 $s^{-1}$ $cm^{-3}$ and c=2.5E-33 $s^{-1}$ $cm^{-6}$. Therefore, this sample verifies A/B~4E17 $cm^3$ and c/B-2E-20 $cm^{-3}$, in accordance with the previous discussion.

In some embodiments, a series of LEDs is created. The efficiency of these LEDs can be fitted with the ABC model as just described. LEDs are improved by reducing the defect density, leading to progressively lower values of A/B and c/B. LEDs are produced until A/B and CB are reduced by at least a factor of 2. In some embodiments this leads to an IQE increase of at least 5% at a current density larger than Jpeak*10. In some embodiments, the series starts with an LED having a peak IQE over 50% (or over 60%, 70%).

Figure 12:
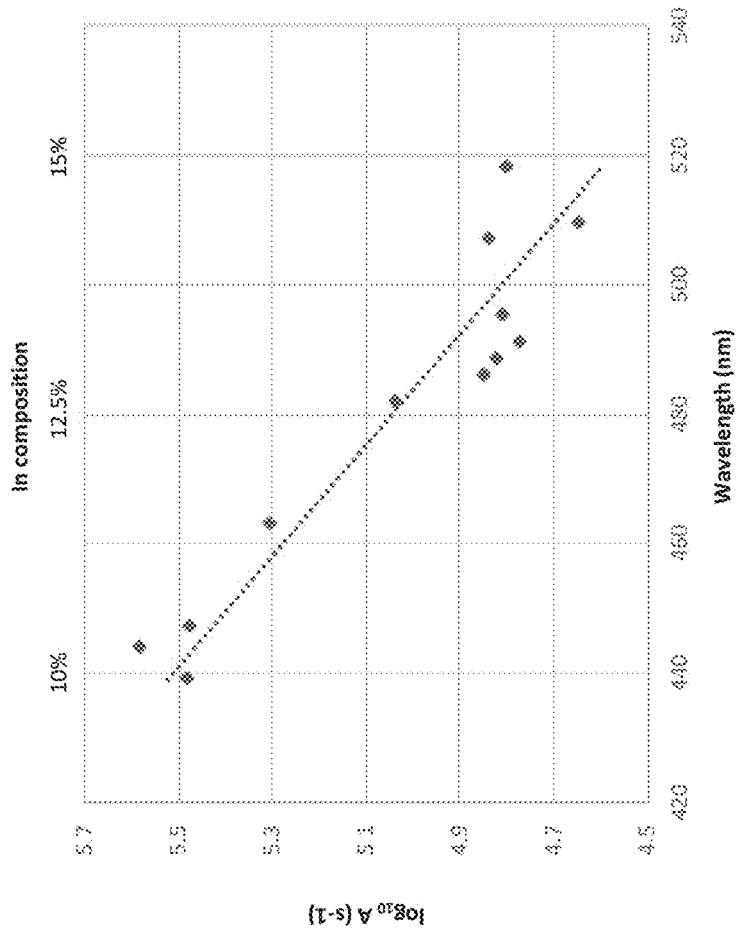
FIG. 12 shows experimental evidence that the SRH coefficient A is influenced by polarization fields.

FIG. 12 shows further experimental evidence that the SRH coefficient A is influenced by polarization fields. FIG. 12 shows A versus wavelength/In content, for a series of SQW samples (thickness 4 nm, varying composition in the range 10-15%), all having a peak IQE of about 85% (measured in photoluminescence). As the In content increases, the polarization field increases and A decreases. Empirically, the trend is linear with a slope of −0.0117. Therefore, when samples of different wavelengths are compared, their values of A can be renormalized as follows to compensate for this variation: log 10(Acorr)=log 10(A)+0.0117*Δλ, where Δλ is the difference in wavelength between samples (with an arbitrary wavelength origin) and A is the experimental value.

FIGS. 13(A)-(F) show further experimental evidence of the effect of polarization field (driven by wavelength/composition) on various recombination parameters. Specifically, FIGS. 13 (A)-(F) pertain to a series of three SQW samples (t=4 nm, composition of 12.4%/13.8%/15.2% respectively) measured in photoluminescence. FIG. 13 (A) shows that all of these samples have a similar peak IQE of about 75-80%. FIG. 13 (B) shows the difference in lifetimes between samples, caused by the difference in polarization field. FIG. 13 (C) shows the samples' wavelengths. FIGS. (D)-(F) show the value of recombination parameters A, B and c versus carrier density. All these parameters decrease when the sample composition increases, with the following approximate values:

| lambda | xIn | A | B | C |
| --- | --- | --- | --- | --- |
| 480 | 12.4 | 5.3 | −12.4 | −31.8 |
| 500 | 13.8 | 5.15 | −12.7 | −32.15 |
| 520 | 15.2 | 4.9 | −12.9 | −32.4 |

This table indicates how samples of different compositions can be compared, by correcting their recombination parameters for polarization-field-driven effects.

Example 4—Performance Improvement at Long Wavelength

Embodiments enable performance improvement at long wavelength, i.e. improvements over the green gap.

Figure 14:
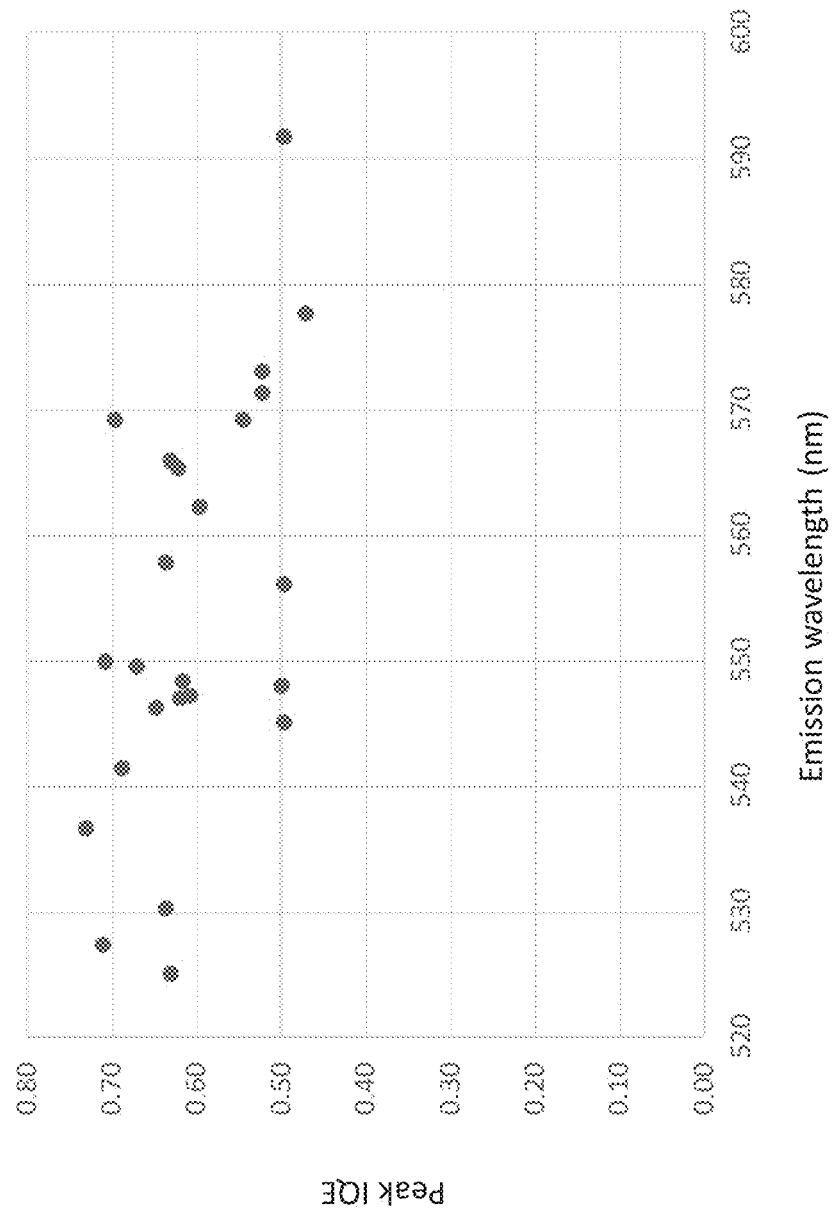
FIG. 14 shows the experimental peak IQE of a series of SQW samples with varying composition, having improved epitaxial quality.

FIG. 14 shows the experimental peak IQE of a series of SQW samples (thickness 4 nm) with varying composition, having improved epitaxial quality. In a wide wavelength range, the best samples have a peak IQE of about 70%, irrespective of their composition. Even at a wavelength of 590 nm, a peak IQE of 50% is achieved. It is anticipated that, with further practice of the teachings herein, even-higher IQEs will be accessible, e.g. peak IQE of at least 70% at wavelengths of 600 nm and above, or in a range 580-620 nm or 600-630 nm.

FIG. 15(A)-(D) show additional data for some samples shown in FIG. 14, having varying composition/wavelength. FIG. 15 (A) shows their wavelength. FIG. 15 (B) shows their IQE (all samples have a peak IQE of about 70%, except for the longest-wavelength sample). FIG. 15 (C) shows their SRH coefficient A. FIG. 15(D) shows the relationship between wavelength and IQE for each sample. The dashed line shows 70% IQE. It is anticipated that further improvements according to the teachings herein will enable higher IQE at longer wavelength.

Figure 16F:
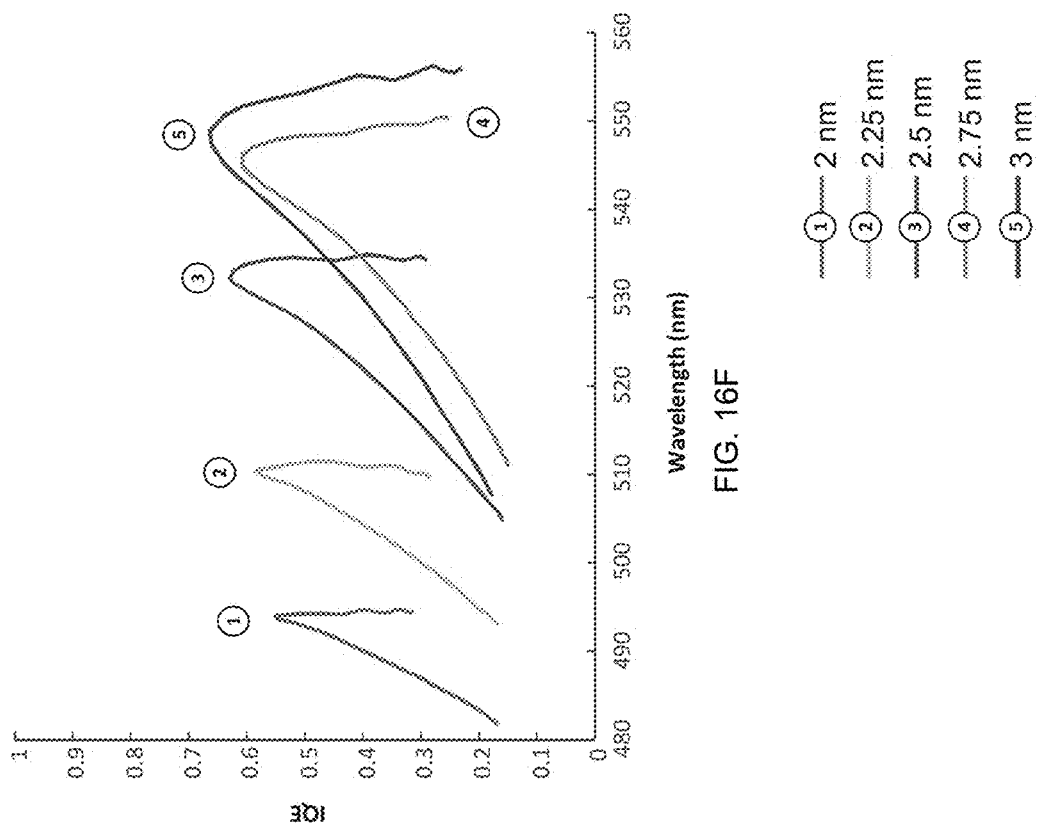
Figure 16E:
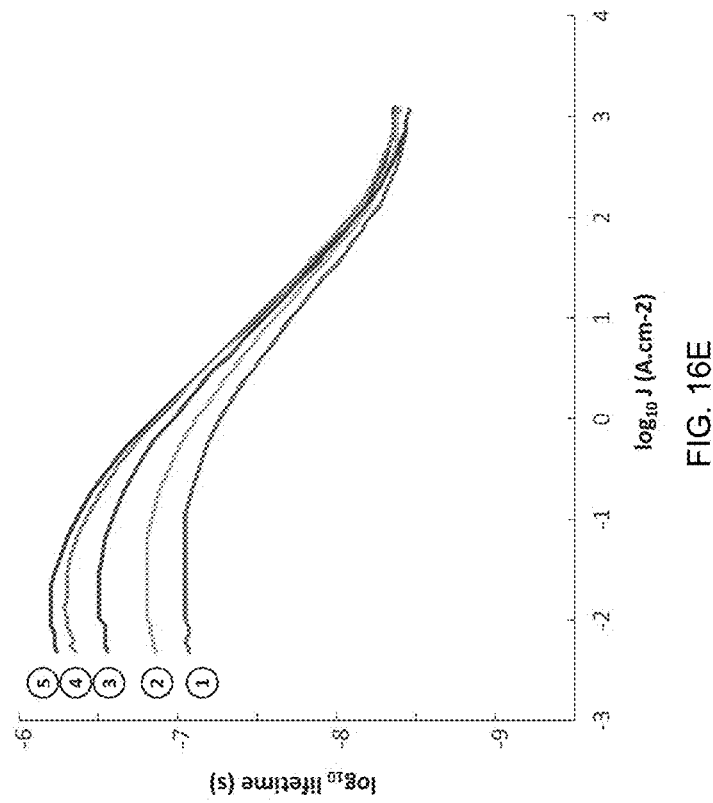

FIG. 16 (A)-(F) show how long-wavelength performance can further be influenced by the design of the active region—in this case, the thickness of the SQW. FIG. 16 (A)-(F) show experimental photoluminescence data for a series of QWs having a nominal In composition of 25%, and varying thicknesses in the range 2-3 nm. FIG. 16 (A) shows that, as the thickness is reduced, the emission wavelength is blue-shifted. This is attributed to a reduction in quantum-confined Stark effect in thinner QWs. Accordingly, the electron-hole overlap should increase in thinner QWs. This is confirmed by the trend of the A and B coefficients shown in FIG. 16 (C)-(D): the coefficients increase with decreasing thickness, due to the increased overlap. FIG. 16 (B) shows the resulting IQE. In this case, the thicker QWs have a higher peak IQE due to the non-trivial variation of A and B with thickness. Accordingly, some embodiments comprise InGaN QWs with an In composition of at least 25% and a thickness in a range 2.25-3 nm. FIG. 16 (E) shows the corresponding lifetime, which is faster for thinner samples (due to the increased wavefunction overlap). FIG. 16 (F) shows the relationship between IQE and wavelength for these samples.

Example 5—Relationship Between B and C

As discussed, the droop coefficient c is the sum of two terms: c=C+D. In samples with low SRH coefficient, D is small and c is nearly equal to C. In these samples, it is possible to examine the wavefunction-dependence of coefficients C and D. As shown herein, there is a systematic correlation between B and C, even when the details of the samples vary strongly.

FIG. 17(A) shows the experimental coefficient B for a series of SQW samples having various QW structures (thickness and composition, as indicated). The density-dependence of B is complex and depends on the sample. The density-dependence of B is caused by multiple effects (including polarization-field, carrier localization, and Coulomb enhancement). Regardless, for each given sample, this dependence is indicative of a variation in the electron-hole overlap I, since the B coefficient should scale with I. FIG. 17(B) shows the corresponding values of c, as full lines. Further, a model to predict c based on B is shown for each sample as dashed lines. The model is as follows:

for 4-nm-thick samples, $\log_{10}(c)=-18.3+1.1*\log_{10}(B)$ for 2.5-nm-thick samples, $\log_{10}(c)=-17.3+1.15*\log_{10}(B)$ The agreement between the measured and predicted value of c is remarkable. This indicates that c depends on the B coefficient with a power law, namely $c \sim B^{1.1-1.15}$. In other words, c depends on the wavefunction overlap with a power law, namely $c \sim I^{2.2-2.3}$.

Figure 18B:
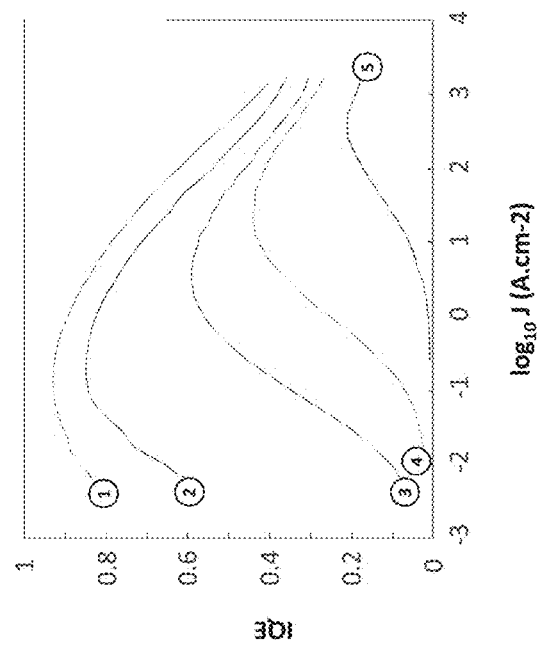
FIGS. 18B-18C show that the slope of the relationship is dependent on the IQE of the sample.
Figure 18C:
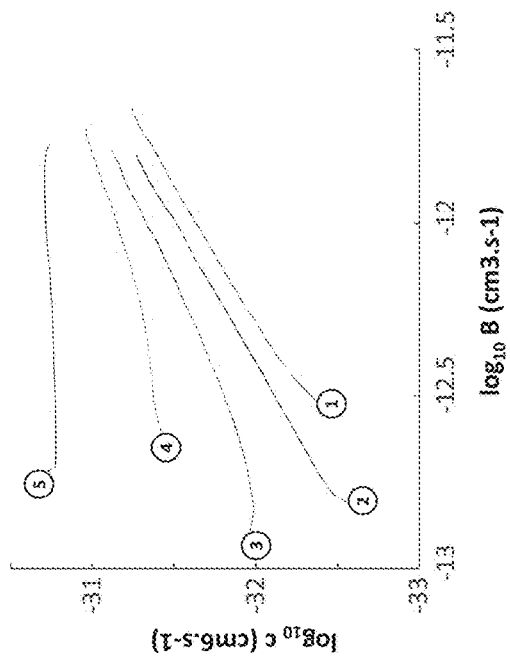
Figure 18A:
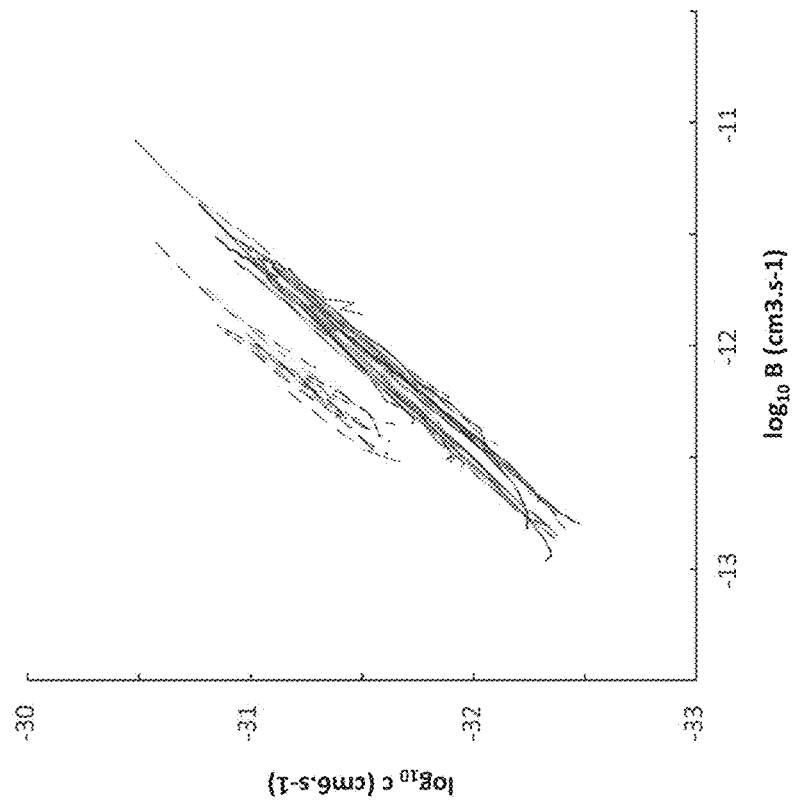
FIG. 18A shows the log-log correlation between B and c.

This power law is further exemplified for a large number of SQW samples shown in FIG. 18 (A). FIG. 18 (A) shows the log-log correlation between B and c. For clarity, each curve in FIG. 18(A) is a sample, and the curve shows the correlation between B and c as the carrier density is varied in the LED (in a range 3E18-3E19 cm-3). The full curves are for samples with a thickness of about 4 nm and a composition of about 12-16%. The dashed curves are for SQW samples with a thickness of about 2.5 nm and a composition of about 22-27%. Each curve is nearly-exactly linear, with a slope of about 1.1-1.15, as described previously. This confirms that the power scaling law between B and C is systematically observed.

FIGS. 18 (B)-(C) show that the slope of the relationship is dependent on the IQE of the sample. FIG. 18 (B) shows the photoluminescence IQE of four samples (4 nm-thick SQW, [In]=12-13%) having varying levels of defects and hence varying IQE. FIG. 18 C shows the relationship between B and c for these samples. In all cases, the relationship is approximately linear, indicating that B and c are related by a power law c Bq. However, the value of the exponent q is directly related to the IQE, as shown in the table below:

| Sample # | peak IQE % | q |
|---|---|---|
| 1 | 93 | 1.26 |
| 2 | 85 | 1.21 |
| 3 | 59 | 0.92 |
| 4 | 44 | 0.58 |
| 5 | 21 | 0.09 |

Samples with a higher IQE have a larger exponent, with a maximum observed value here of about 1.26. In contrast, for lower-IQE samples, the exponent is smaller. In other high-quality samples with high composition ([In]-25%) and thinner quantum wells (2.5 nm), Applicants have also observed exponents of about 1.46 and peak IQEs above 70%. In one embodiment, the device comprises a III-Nitride LED characterized by an emission wavelength longer than 550 nm, an active region concentration of In no less than 25%, a peak IQE above 40%, a carrier density n, and recombination coefficients A, B(n), c(n), wherein c(n) is proportional to $B(n)^q$, wherein q is at least 0.8, 0.9, 1.0, 1.1, or 1.2.

This observation leads to another way to characterize samples having low-enough defect density, i.e. whose droop is mostly caused by the intrinsic coefficient C rather than by the extrinsic coefficient D. For such samples, c is nearly equal to C and the relationship between B and c (as power density is varied) is a power law with a large exponent. Accordingly, some embodiments are characterized by a power law between B and c having a high-enough exponent. Some embodiments have exponents in a range 1-1.3 or 0.8-1.3. In particular, some embodiments possess a light-emitting region having layers of high indium content (at least 20% or 25% or 30%) and the relationship between their B and c coefficients are power laws having a high exponent (at least 0.8 or 1 or 1.1 or 1.2 or 1.3 or 1.4 or 1.5 or 1.6).

Example 6—Doping Effects

Some embodiments are further configured with a doped active region, which may influence their recombination coefficients. The doping may be caused by impurities or modulation doping.

FIGS. 19(A)-(F) show an example of a series of QWs with modulation doping. The doping series is obtained by varying the position of the SQW inside the intrinsic region (of total width 200 nm) of a p-i-n diode. The position is quantified by the percentage of the thickness at which the QW is placed (with 0% being the n-side and 100% being the p-side). A position of 50% corresponds to the middle of the intrinsic region, and to minimized modulation doping. When the QW position is varied on either side, modulation doping occurs. Doping has two effects: (1) it changes the dynamics by adding a background doping term n0/p0; and (2) it causes field screening.

FIG. 19(A) shows the IQE of each sample, which is roughly constant. FIG. 19 (B) shows the lifetime, which becomes faster with higher doping (due to field screening and the background doping term). FIG. 19 (C) shows the wavelength, which becomes shorter with doping (due to field screening). FIG. 19 (D)-(F) shows the resulting coefficients A, B and c, which vary following the doping level.

Depending on the sample, the doping level is in the range 1E17-2E19 cm-3. Accordingly, some embodiments may have active layers which are n- or p-doped with a doping level of at least 1E17c-m3 or 1E18 cm-3 or 1E19 cm-3, or in a range 1E17-1E20 cm-3.

Having thus described a few particular embodiments of the invention, various alterations, modifications, and improvements will readily occur to those skilled in the art. Such alterations, modifications, and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A method of improving high-current density efficiency of an LED, said method comprising:
   (a) preparing a series of LEDs having decreasing defect densities, wherein each LED of said series has a peak Internal Quantum Efficiency (IQE) of at least 50%, and wherein each LED of said series has the same epitaxial structure;
   (b) determining an increase in IQEs at high-current density between at least two LEDs of said series;
   (c) preparing at least an additional LED of said series by reducing defect density relative to the previously obtained lowest defect density; and
   (d) reiterating steps (b) and (c) until said increase in IQEs is at least 3% between two LEDs of said series having a decrease X in defect densities.

2. The method of claim 1, wherein X is at least 50%.

3. The method of claim 1, further comprising:
   (e) reiterating steps (b) and (c) until said increase in IQE at high current density between two LEDs in said series having a decrease in defect densities of at least said X is less than 2%.

4. The method of claim 1, wherein said high current density is above 100 A.cm-2.

5. The method of claim 1, wherein, in step (b), defect density between said two LEDs is reduced by a factor of 1/X, and said increase in IQEs is 0.1 *ln(1/X), at 100A.cm-2.

6. The method of claim 1, wherein, in step (b), defect density between said two LEDs is reduced by a factor of 1/X, and said increase in IQEs is -k*ln(1/X), where k is in the range 0.05-0.15 or in, the range 0.03-0.2.

7. An LED from the process of claim 1, said LED having said increase of at least 3% over another LED of said series.

8. A method of improving high-current density efficiency of an LED, said method comprising:
   (a) preparing a series of LEDs having decreasing defect densities, wherein each LED of said series has an IQE at J_low, and wherein each LED of said series has substantially the same epitaxial structure;
   (b) determining an increase in IQEs at J_low between at least two LEDs of said series;
   (c) preparing at least an additional LED of said series by reducing defect density relative to the previously obtained lowest defect density; and
   (d) reiterating steps (b) and (c) until said increase is at least 10% between two LEDs of said series having a decrease X in defect densities, wherein said increase corresponds to an increase in IQE at high current density of more than 3%.

9. The method of claim 8, further comprising determining said increase in IQE at high current density of more than 3%.

10. The method of claim 8, wherein X is at least 50%.

11. The method of claim 10, further comprising:
    (e) reiterating steps (b) and (c) until said increase in IQE at J_low between two LEDs in said series having a decrease in defect densities of at least said X is less than 2%.

12. An LED from the process of claim 8, said LED having said increase of at least 3% over another LED of said series.

13. A device comprising:
    a III-Nitride LED having a light-emitting region characterized by an emission wavelength longer than 550 nm, and having recombination coefficients A, B, c with A/B less than 5E18 $cm^3$ and c/B less than 5E-19 $cm^{-3}$, and a peak IQE above 40%.

14. The device of claim 13, wherein the recombination coefficients are evaluated from a fit of the IQE within +/1 one decade of current around a peak current corresponding to the peak IQE.

15. The device of claim 13, wherein the light-emitting region comprises at least one light-emitting layer with an indium composition larger than 25%.

16. The device of claim 13, wherein an SRH-causing defect in the active region has a surface density less than 1E8 cm-2.

17. The device of claim 13, wherein an SRE-causing defect in the active region has a surface density less than 1E7 cm-2.

18. The device of claim 13, wherein an SRH-causing defect in the active region has a surface density less than 1E6 cm-2.

19. The device of claim 18, wherein the SRH-causing defect is an impurity.

20. The device of claim 18, wherein the SRH-causing defect is an intrinsic defect selected from: an interstitial, a vacancy, a complex.

21. The device of claim 20, wherein the intrinsic defect pertains to Ga.

22. The device of claim 20, wherein the intrinsic defect pertains to N.

* * * * *